(12) United States Patent
Terada et al.

(10) Patent No.: US 12,147,675 B2
(45) Date of Patent: Nov. 19, 2024

(54) MEMORY MODULE

(71) Applicant: SONY SEMICONDUCTOR SOLUTIONS CORPORATION, Kanagawa (JP)

(72) Inventors: Haruhiko Terada, Kanagawa (JP); Yotaro Mori, Kanagawa (JP); Riichi Nishino, Kanagawa (JP); Yoshiyuki Shibahara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/997,862

(22) PCT Filed: Apr. 16, 2021

(86) PCT No.: PCT/JP2021/015770
§ 371 (c)(1),
(2) Date: Nov. 3, 2022

(87) PCT Pub. No.: WO2021/230003
PCT Pub. Date: Nov. 18, 2021

(65) Prior Publication Data
US 2023/0229313 A1 Jul. 20, 2023

(30) Foreign Application Priority Data

May 11, 2020 (JP) .................................. 2020-083231

(51) Int. Cl.
*G06F 12/00* (2006.01)
*G06F 3/06* (2006.01)
*G06F 12/10* (2016.01)

(52) U.S. Cl.
CPC .......... *G06F 3/0611* (2013.01); *G06F 3/0659* (2013.01); *G06F 3/0673* (2013.01); *G06F 12/10* (2013.01); *G06F 2212/1024* (2013.01)

(58) Field of Classification Search
CPC .... G06F 3/0647; G06F 3/0616; G06F 3/0659; G06F 3/0673; G06F 12/10;
(Continued)

(56) References Cited

U.S. PATENT DOCUMENTS

| 5,253,203 A | * | 10/1993 | Partovi | ............... G06F 12/0893 |
| | | | | 711/E12.063 |
| 10,474,527 B1 | * | 11/2019 | Sun | ...................... G06F 11/1068 |

(Continued)

FOREIGN PATENT DOCUMENTS

| JP | 2013-239142 A | 11/2013 |
| JP | 2015-522886 A | 8/2015 |

(Continued)

OTHER PUBLICATIONS

International Search Report and Written Opinion of PCT Application No. PCT/JP2021/015770, issued on Jun. 8, 2021, 08 pages of ISRWO.

*Primary Examiner* — Shawn X Gu
*Assistant Examiner* — Mohammad S Hasan
(74) *Attorney, Agent, or Firm* — CHIP LAW GROUP

(57) ABSTRACT

Provided is a memory module which includes a controller which, upon reception of a read command including a logical address, converts the logical address included in the read command into a physical address using address lookup information. The controller further inputs a first physical address, which is a portion of the physical address obtained by the conversion, to a non-volatile memory via a first address bus terminal, and then inputs a second physical address, which is a rest of the physical address obtained by (Continued)

the conversion, to the non-volatile memory via a second address bus terminal, to thereby read data corresponding to the physical address obtained by the conversion from the non-volatile memory.

16 Claims, 14 Drawing Sheets

(58) Field of Classification Search
CPC ........... G06F 2212/657; G06F 11/0751; G06F 11/076; G06F 11/073; G06F 11/0793; G06F 2212/7201; G06F 2212/7208; G06F 12/0246
See application file for complete search history.

(56) References Cited

U.S. PATENT DOCUMENTS

| | | | |
|---|---|---|---|
| 10,592,428 B1* | 3/2020 | Saidi | G06F 12/0891 |
| 2006/0139986 A1* | 6/2006 | Kang | G11C 11/22 |
| | | | 365/145 |
| 2011/0141828 A1* | 6/2011 | Yoko | H01L 25/18 |
| | | | 365/219 |
| 2012/0063234 A1* | 3/2012 | Shiga | G11C 16/10 |
| | | | 365/185.25 |
| 2013/0151792 A1* | 6/2013 | Smith | G06F 1/10 |
| | | | 711/147 |
| 2015/0019803 A1* | 1/2015 | Miller | G06F 3/0611 |
| | | | 711/125 |
| 2015/0220385 A1* | 8/2015 | Wood | G06F 3/061 |
| | | | 714/6.24 |
| 2017/0147499 A1* | 5/2017 | Mohan | G06F 3/0688 |
| 2018/0188976 A1* | 7/2018 | Koo | G06F 12/0215 |
| 2019/0065396 A1* | 2/2019 | Troia | G06F 3/0688 |
| 2019/0146925 A1* | 5/2019 | Li | G06F 12/0246 |
| | | | 711/103 |
| 2019/0163393 A1* | 5/2019 | Cox | G06F 3/0673 |
| 2019/0163566 A1* | 5/2019 | Gholamipour | G06F 11/1068 |
| 2019/0164610 A1* | 5/2019 | Zamir | G06F 11/108 |
| 2019/0196745 A1* | 6/2019 | Persson | G06F 13/28 |
| 2019/0214065 A1* | 7/2019 | Kim | G06F 11/1068 |
| 2019/0272230 A1* | 9/2019 | Xiao | G06F 12/02 |
| 2019/0310780 A1* | 10/2019 | Gholamipour | G06F 3/0679 |
| 2021/0091792 A1* | 3/2021 | Kifune | H03M 13/45 |
| 2021/0184699 A1* | 6/2021 | Kwak | H03M 13/1575 |
| 2022/0156152 A1* | 5/2022 | Gao | G06F 3/0689 |

FOREIGN PATENT DOCUMENTS

| | | |
|---|---|---|
| JP | 2015-225608 A | 12/2015 |
| JP | 2016-184402 A | 10/2016 |
| WO | 2012/140903 A1 | 10/2012 |
| WO | 2016/067846 A1 | 5/2016 |

\* cited by examiner

[FIG. 1]
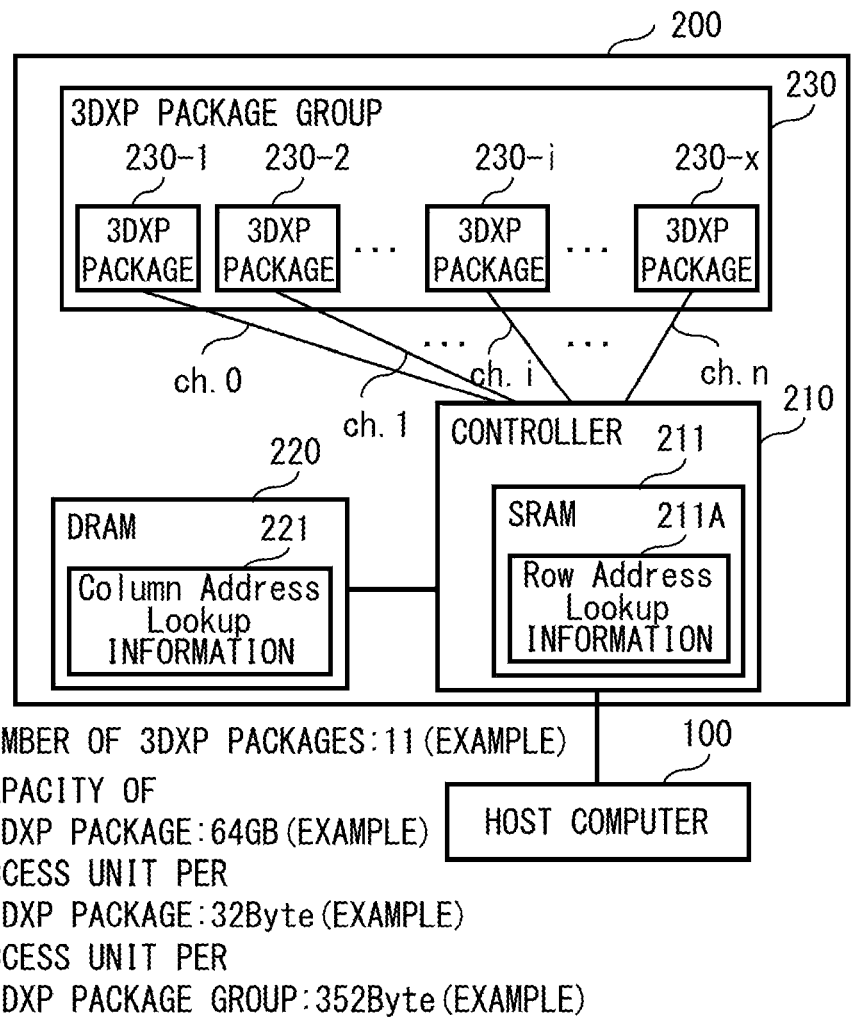
[FIG. 2]
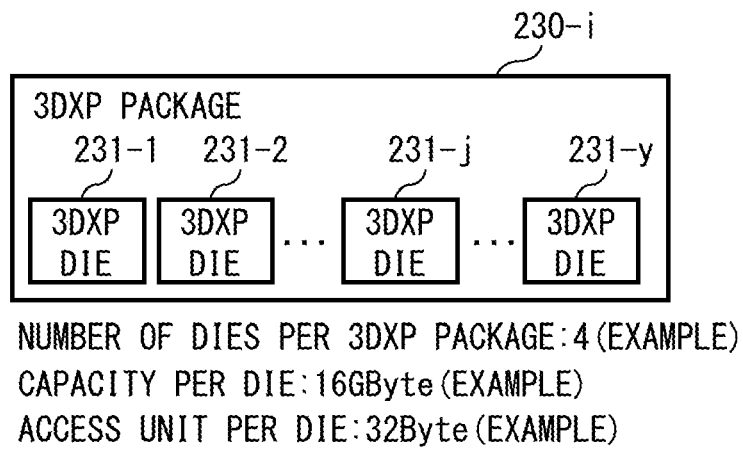

[FIG. 3]
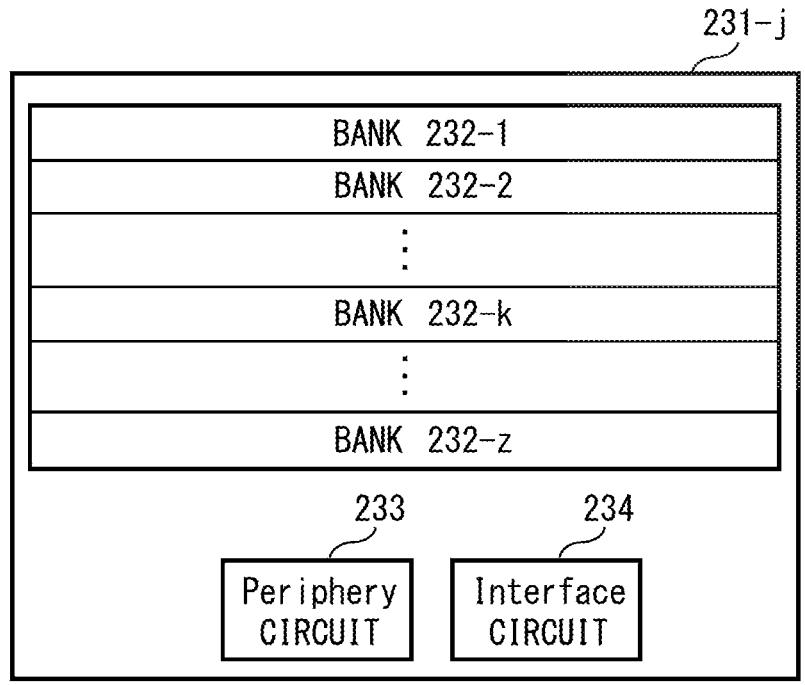
NUMBER OF BANKS PER DIE:16(EXAMPLE)
ACCESS UNIT PER BANK:32Byte(EXAMPLE)
CAPACITY OF BANK:8GBit(EXAMPLE)
[FIG. 4]
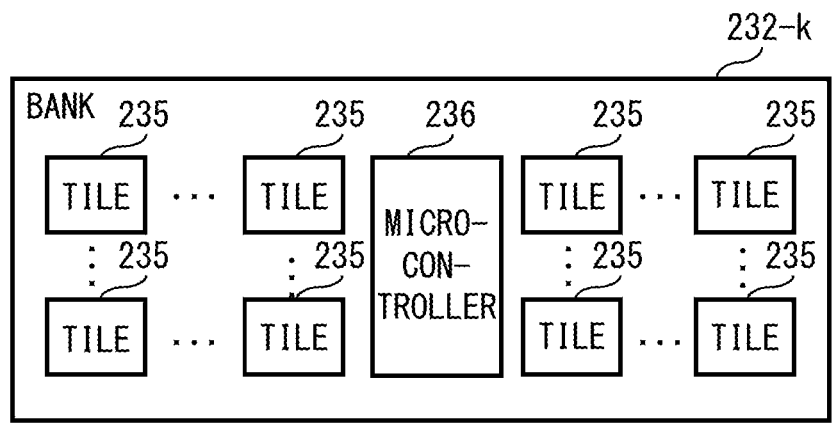
NUMBER OF TILES PER BANK:256(EXAMPLE)
ACCESS UNIT PER TILE:1bit(EXAMPLE)
CAPACITY OF TILE:32Mbit(EXAMPLE)

[FIG. 5]
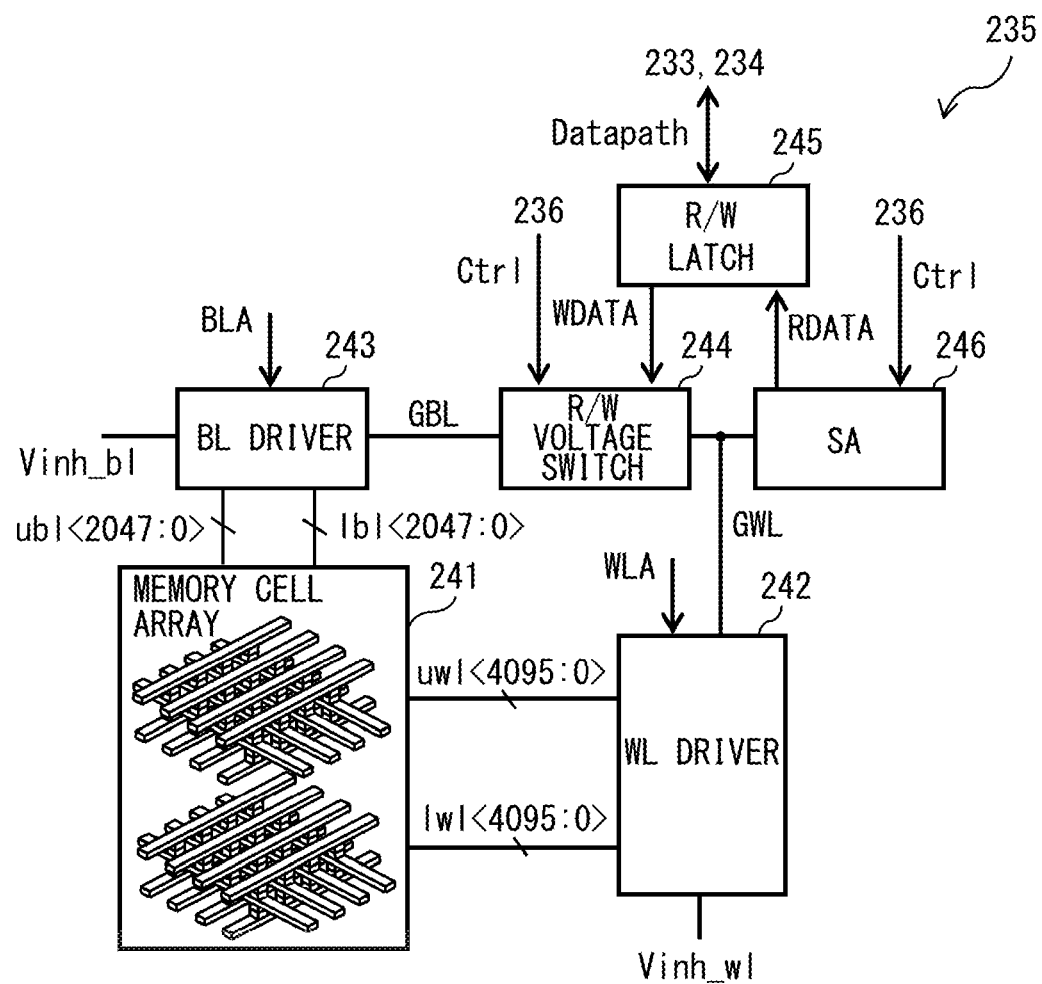

[FIG. 6]
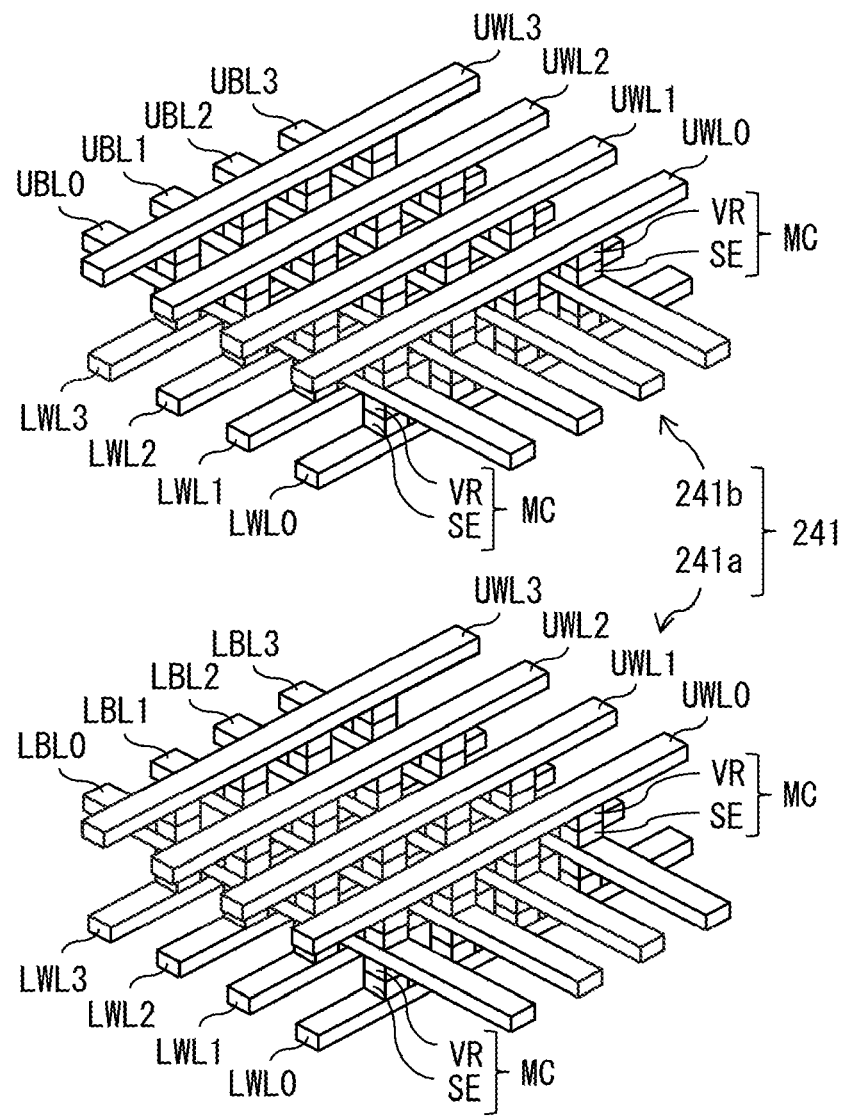

[FIG. 7]
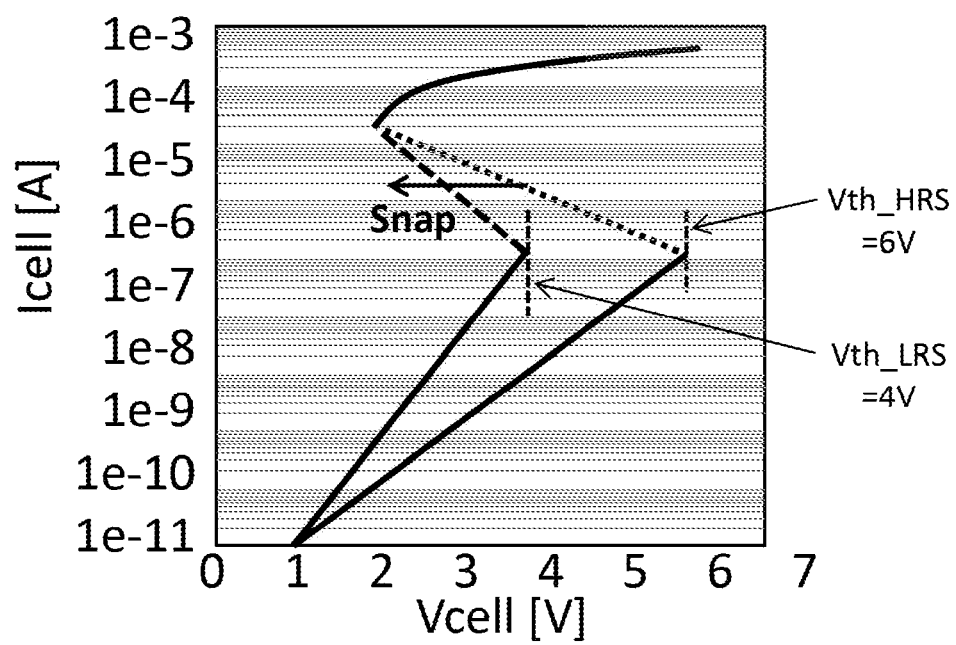

[FIG. 8]
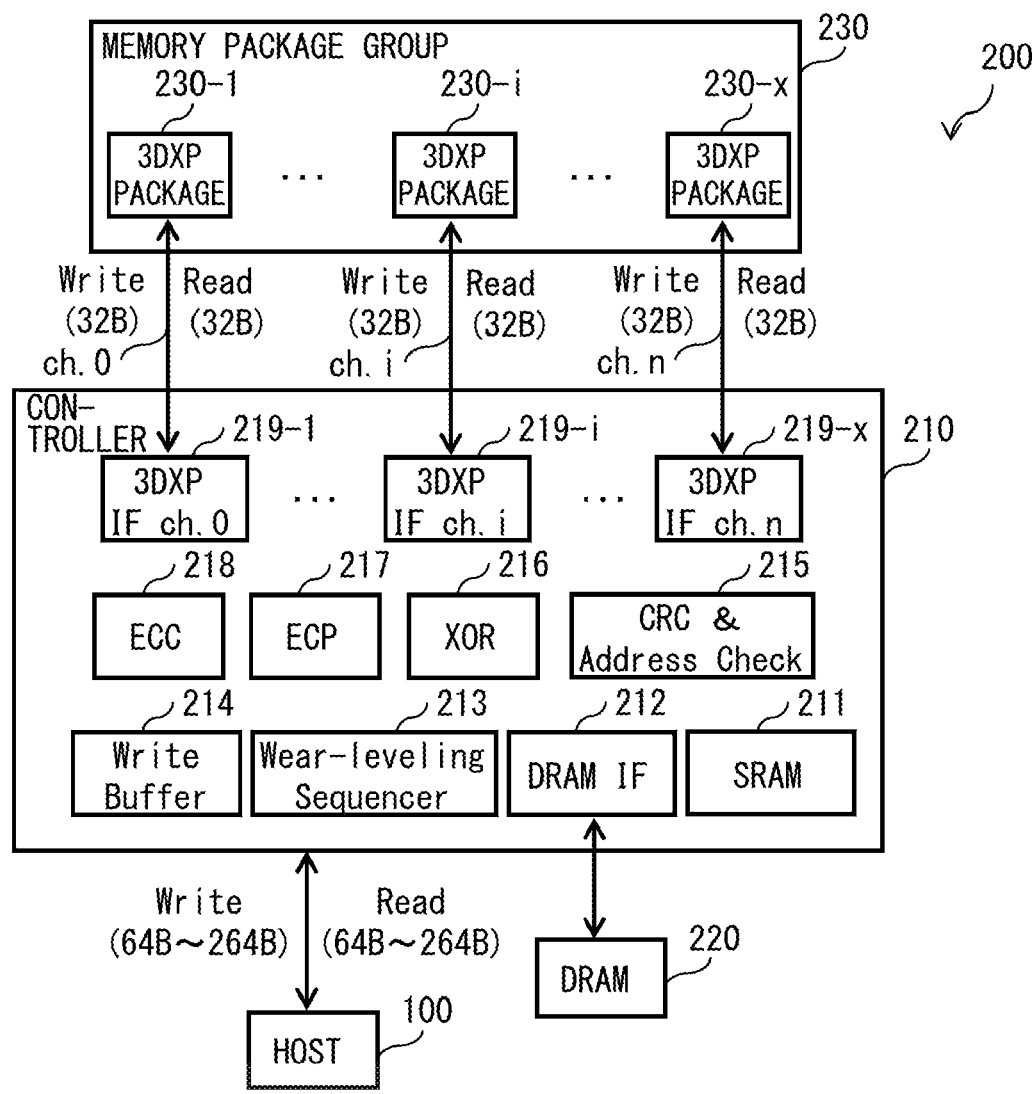

[FIG. 9]

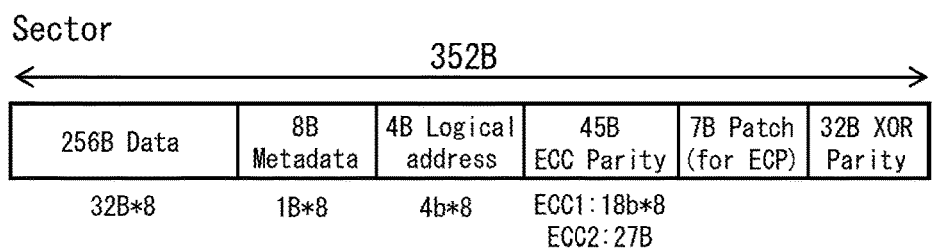

Sector

| 256B Data | 8B Metadata | 4B Logical address | 45B ECC Parity | 7B Patch (for ECP) | 32B XOR Parity |
|---|---|---|---|---|---|
| 32B*8 | 1B*8 | 4b*8 | ECC1:18b*8 ECC2:27B | | |

| Signal Name | Pin Description | Direction | Type | Speed | Pin count per 3DXP pkg. | Num. of ch. sharing same ctrler pin | Ctrler pin count for 3DXP IF (11ch. total) |
|---|---|---|---|---|---|---|---|
| ck/ckb | Clock | Ctrler to 3DXP | CK | 1GHz | 2 | 2 | 12 |
| cke | Clock Enable | Ctrler to 3DXP | CA | 1GHz | 1 | 2 | 6 |
| csb | Chip Select | Ctrler to 3DXP | CA | 1GHz | 1 | 1 | 11 |
| ca1 | Command, Row Address | Ctrler to 3DXP | CA | 1GHz | 4 | 2 | 24 |
| ca2 | Column Address | Ctrler to 3DXP | CA | 1GHz | 2 | 2 | 12 |
| dq[7:0] | Data | Bi-directional | DQ | DDR 2GT/s | 8 | 1 | 88 |
| dqs/dqsb | Data Strobe | Bi-directional | DQ | 1GHz | 2 | 1 | 22 |
| alertb | Alert | 3DXP to Ctrler | Open Drain | 250MHz | 1 | 1 | 11 |
| resetb | Reset | Ctrler to 3DXP | CMOS | DC | 1 | 11 | 1 |
| total | | | | | | | 187 |

[FIG. 11]

| pin | 0th cycle | 1st cycle | 2nd cycle | 3rd cycle | 4th cycle | 5th cycle |
|---|---|---|---|---|---|---|
| CA1[3] | Die ID [2] | CMD [2] | Bank [2] | Row [11] | Row [7] | Row [3] |
| CA1[2] | Die ID [1] | CMD [1] | Bank [1] | Row [10] | Row [6] | Row [2] |
| CA1[1] | Die ID [0] | CMD [0] | Bank [0] | Row [9] | Row [5] | Row [1] |
| CA1[0] | CMD [3] | Bank [3] | Row [12] | Row [8] | Row [4] | Row [0] |

| pin | 0th cycle | 1st cycle | 2nd cycle | 3rd cycle | 4th cycle | 5th cycle |
|---|---|---|---|---|---|---|
| CA2[1] | PAR | Col [9] | Col [7] | Col [5] | Col [3] | Col [1] |
| CA2[0] | Col [1] | Col [8] | Col [6] | Col [4] | Col [2] | Col [0] |

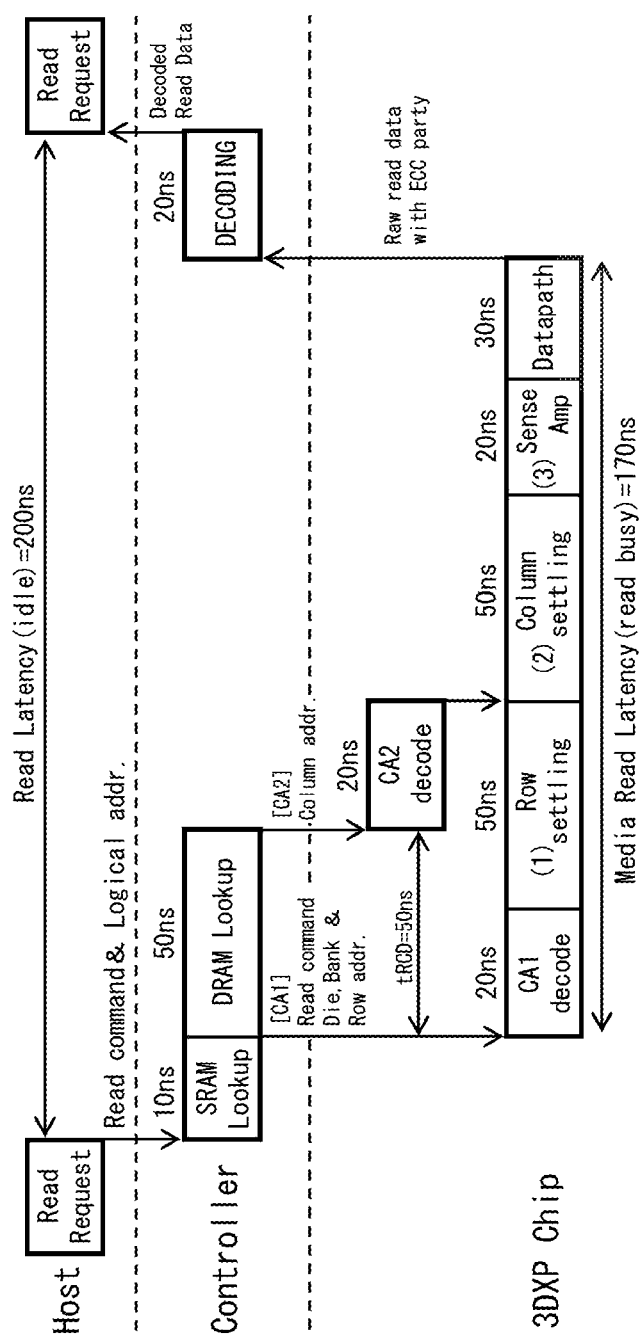
[FIG. 12]

[FIG. 13]
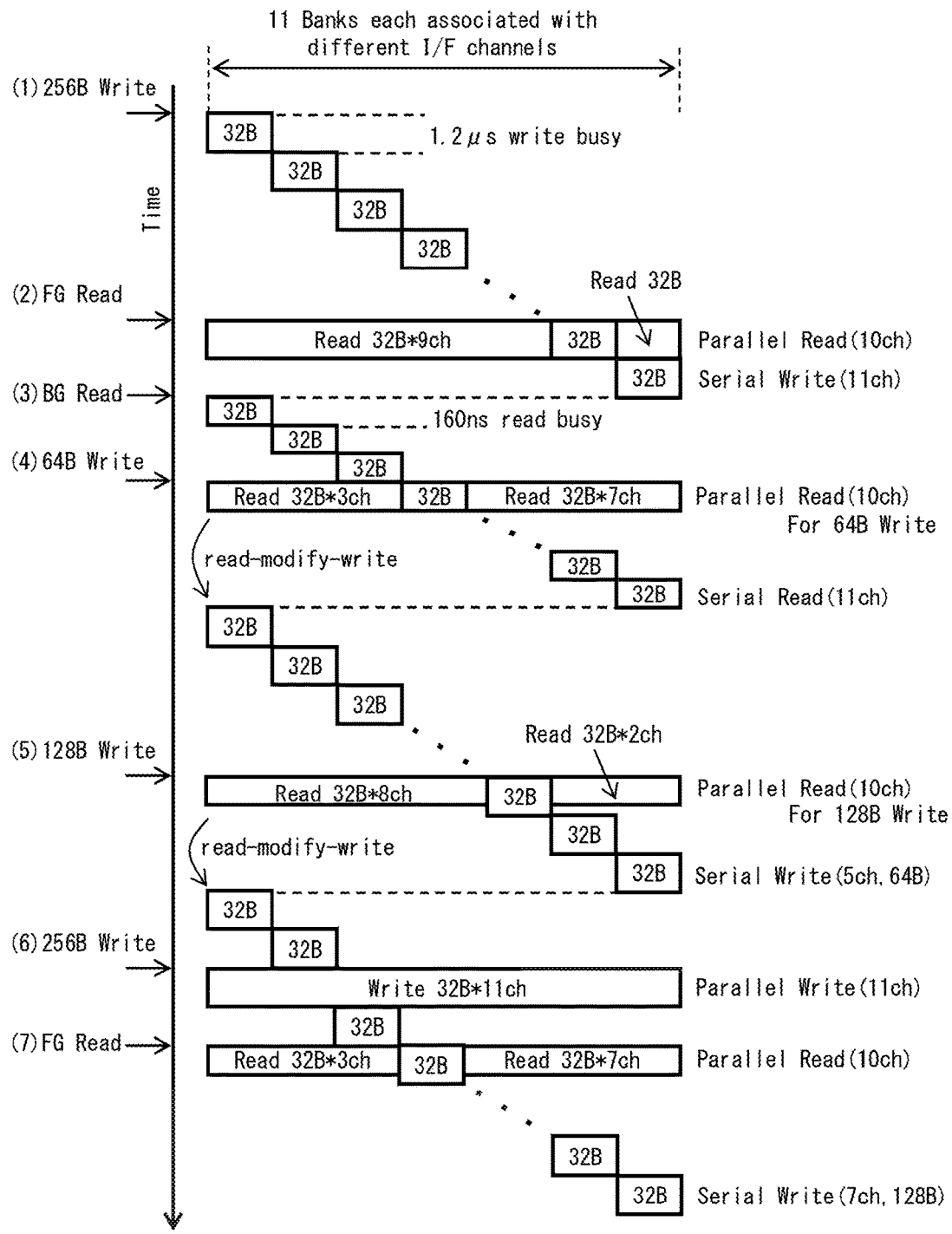

[FIG. 14]
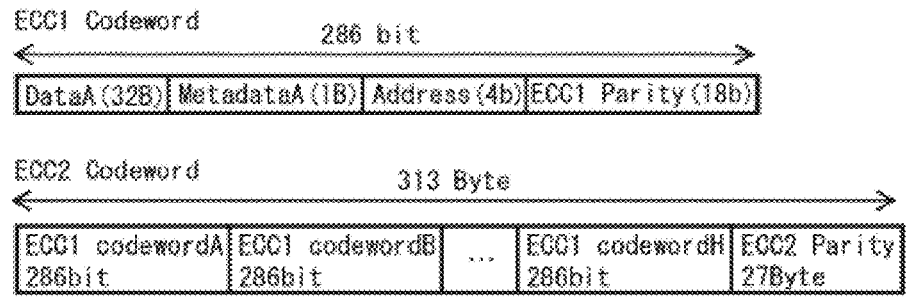
[FIG. 15]
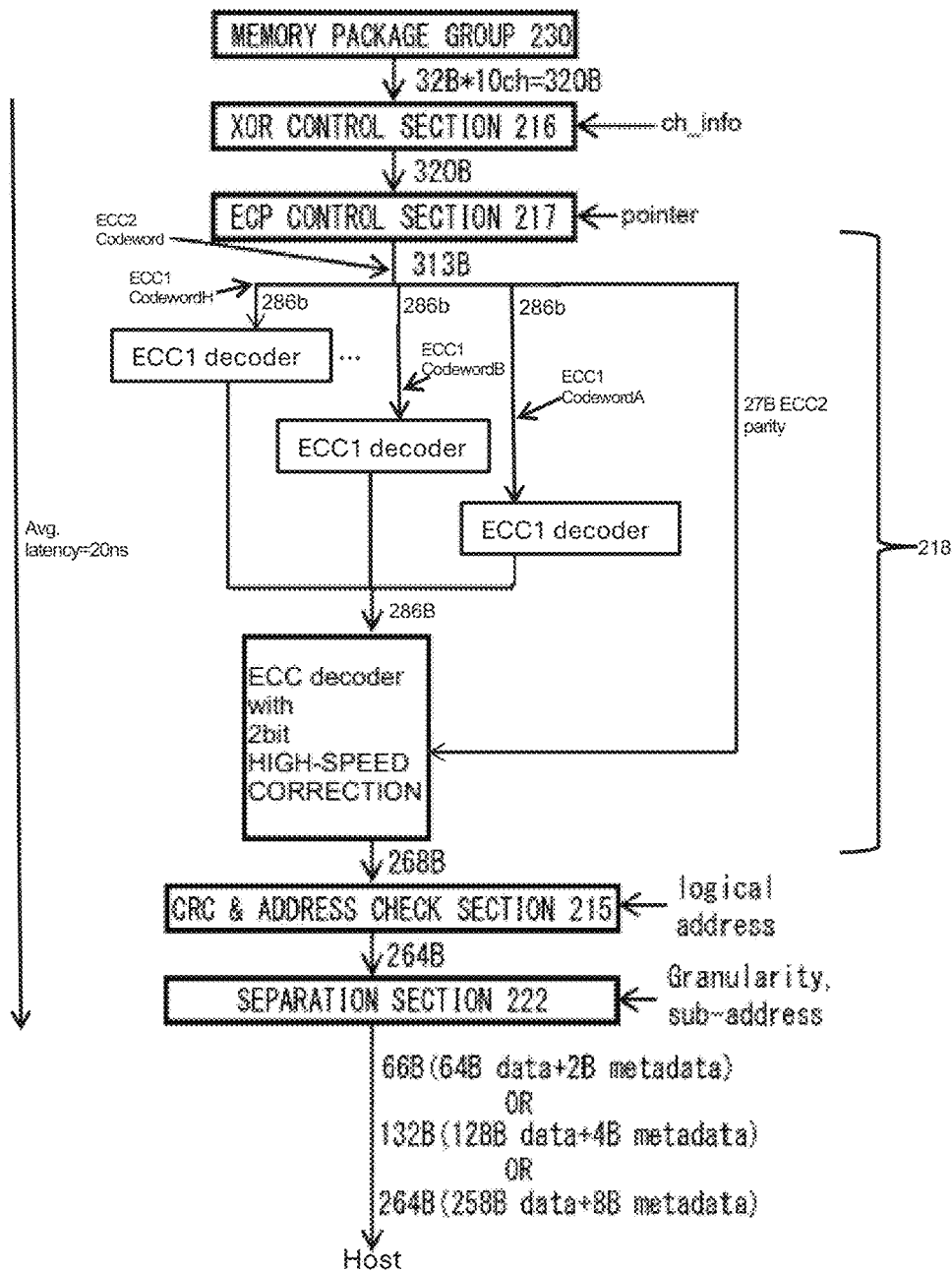

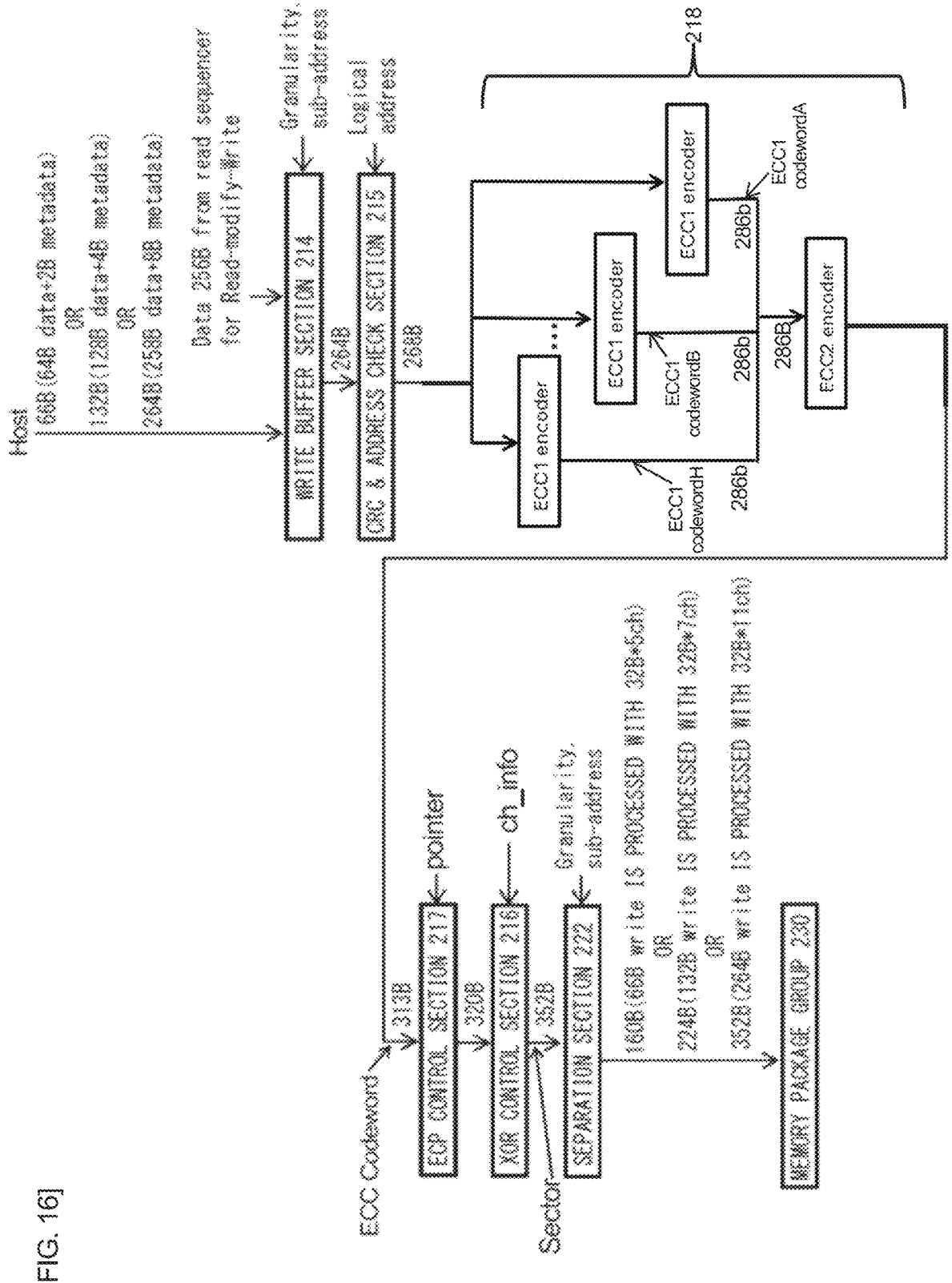
[FIG. 16]

[FIG. 17]

| Ch. 0 | Ch. 1 | Ch. 2 | Ch. 3 | Ch. 4 | Ch. 5 | Ch. 6 | Ch. 7 | Ch. 8 | Ch. 9 | Ch. 10 |
|---|---|---|---|---|---|---|---|---|---|---|
| Data (16B) In code Word A | Data (16B) In code Word A | Data (16B) In code Word C | Data (16B) In code Word C | Data (16B) In code Word E | Data (16B) In code Word E | Data (16B) In code Word G | Data (16B) In code Word G | Metadata(1B) +Address(4b) +ECC1parity(18b) In codeword A ⋮ Metadata(1B) +Address(4b) +ECC1parity(18b) In codeword H Patch(2B) | ECC2 parity (27B) Patch (5B) | XOR (32B) |
| Data (16B) In code Word B | Data (16B) In code Word B | Data (16B) In code Word D | Data (16B) In code Word D | Data (16B) In code Word F | Data (16B) In code Word F | Data (16B) In code Word H | Data (16B) In code Word H | | | |

[FIG. 18]

Share CA (Ch.0↔Ch.1, Ch.2↔Ch.3, Ch.4↔Ch.5, Ch.6↔Ch.7, Ch.8↔Ch.9)

| | Ch. 0 | Ch. 1 | Ch. 2 | Ch. 3 | Ch. 4 | Ch. 5 | Ch. 6 | Ch. 7 | Ch. 8 | Ch. 9 | Ch. 10 |
|---|---|---|---|---|---|---|---|---|---|---|---|
| PA mod11=0 | DataA+B | | DataC+D | | DataE+F | | DataG+H | | ECC1P | ECC2P | XOR |
| PA mod11=1 | XOR | DataA+B | DataC+D | | DataE+F | | DataG+H | | DataA+B | ECC1P | ECC2P |
| PA mod11=2 | ECC2P | XOR | DataA+B | | DataC+D | | DataE+F | | DataG+H | | ECC1P |
| PA mod11=3 | ECC1P | ECC2P | XOR | DataA+B | DataC+D | | DataE+F | | DataG+H | | DataA+B |
| PA mod11=4 | DataA+B | ECC1P | ECC2P | XOR | DataC+D | | DataE+F | | DataG+H | | DataA+B |
| PA mod11=5 | DataA+B | | ECC1P | ECC2P | XOR | DataC+D | DataE+F | | DataG+H | | DataC+D |
| PA mod11=6 | DataA+B | | DataC+D | ECC1P | ECC2P | XOR | DataE+F | | DataG+H | | DataC+D |
| PA mod11=7 | DataA+B | | DataC+D | | ECC1P | ECC2P | XOR | DataE+F | DataG+H | | DataE+F |
| PA mod11=8 | DataA+B | | DataC+D | | DataE+F | ECC1P | ECC2P | XOR | DataG+H | | DataE+F |
| PA mod11=9 | DataA+B | | DataC+D | | DataE+F | | ECC1P | ECC2P | XOR | DataG+H | DataG+H |
| PA mod11=10 | DataA+B | | DataC+D | | DataE+F | | DataG+H | ECC1P | ECC2P | XOR | DataG+H |

[FIG. 19]
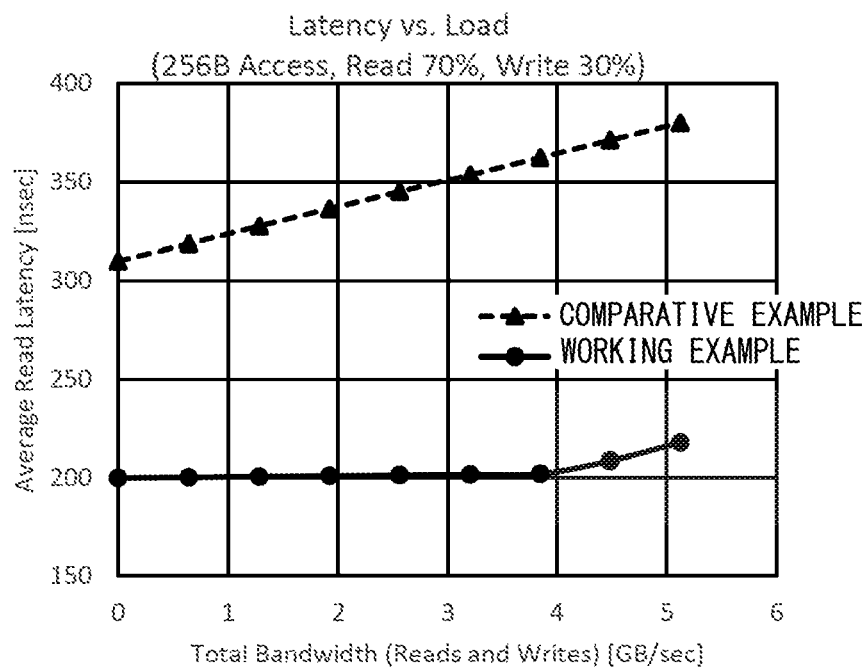
[FIG. 20]
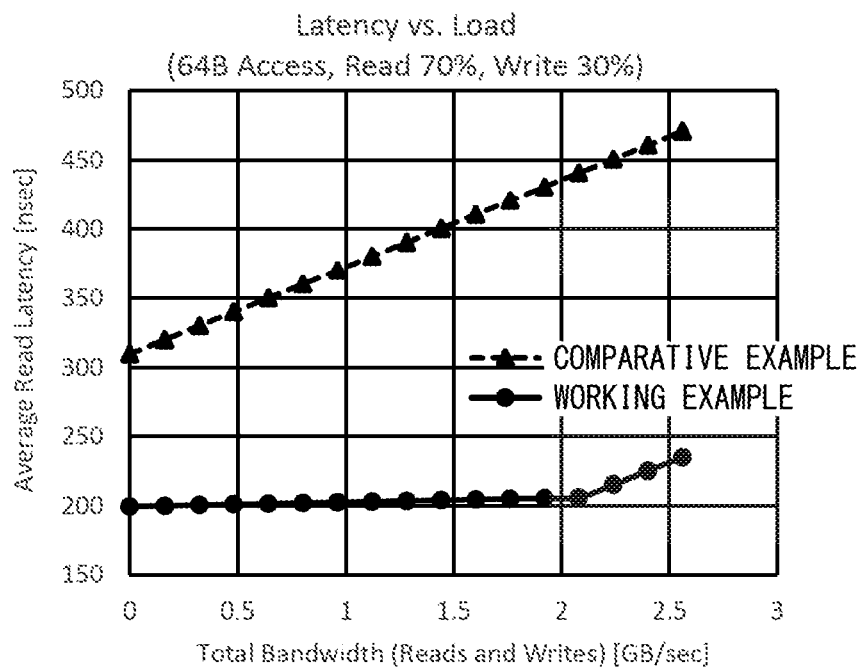

MEMORY MODULE

CROSS REFERENCE TO RELATED APPLICATIONS

This application is a U.S. National Phase of International Patent Application No. PCT/JP2021/015770 filed on Apr. 16, 2021, which claims priority benefit of Japanese Patent Application No. JP 2020-083231 filed in the Japan Patent Office on May 11, 2020. Each of the above-referenced applications is hereby incorporated herein by reference in its entirety.

TECHNICAL FIELD

The present disclosure relates to a memory module.

BACKGROUND ART

A rewritable semiconductor storage having non-volatility has heretofore been known. In recent years, a resistance-change RAM (ReRAM (Resistive RAM) has attracted attention as a rewritable semiconductor storage that has a storage capacity exceeding that of a DRAM while having non-volatility. The ReRAM records information depending on a state of a resistance value of a cell varying with application of a voltage. In particular, Xp-ReRAM (Cross Point ReRAM) has a cell structure in which a resistance change element (VR: Variable Resistor) functioning as a storage element and a selector element (SE: Selector Element) having bidirectional diode characteristics are coupled in series at an intersection part of a word line and a bit line (see, e.g., PTLs 1 to 4).

CITATION LIST

Patent Literature

PTL 1: Japanese Unexamined Patent Application Publication No. 2016-184402
PTL 2: International Publication No. WO2012/140903
PTL 3: International Publication No. WO2016/067846
PTL 4: Japanese Unexamined Patent Application Publication No. 2013-239142

SUMMARY OF THE INVENTION

Incidentally, a memory module including a semiconductor storage described above and a controller that controls access to the semiconductor storage described above is required to have a high reading speed equivalent to that of a DRAM. It is therefore desirable to provide a memory module that makes it possible to obtain a high reading speed.

A memory module according to an embodiment of the present disclosure includes a non-volatile memory, address lookup information, and a controller. The non-volatile memory includes address bus terminals of two systems and a plurality of writable non-volatile memory cells. The address lookup information is mapping information indicating a correspondence relationship between a physical address and a logical address, in which the physical address specifies a data storage region based on some of the plurality of memory cells. The controller, upon reception of a read command including the logical address, converts the logical address included in the read command into the physical address using the address lookup information. The controller further inputs a first physical address, which is a portion of the physical address obtained by the conversion, to the non-volatile memory via an address bus terminal (a first address bus terminal) of one system among the address bus terminals of the two systems, and then inputs a second physical address which is the rest of the physical address obtained by the conversion to the non-volatile memory via an address bus terminal (a second address bus terminal) of another system among the address bus terminals of the two systems, to thereby read data corresponding to the physical address obtained by the conversion from the non-volatile memory.

In the memory module according to an embodiment of the present disclosure, the first physical address which is a portion of the physical address is inputted to the non-volatile memory via the first address bus terminal, and then the second physical address which is the rest of the physical address is inputted to the non-volatile memory via the second address bus terminal, to thereby allow data corresponding to the physical address from the non-volatile memory. This allows for, for example, conversion of the first logical address, which is a portion of the logical address included in the read command, into the first physical address, and conversion of the second logical address, which is the rest of the logical address included in the read command, into the second physical address, within a first period in which the first physical address is inputted to the non-volatile memory via the first address bus terminal. As a result, as compared with a case where address conversion and address input to the non-volatile memory are performed in turn, with only the address bus terminal of one system being provided in the non-volatile memory, for example, it is possible to shorten time (read latency) required for reading, at least by time required for converting the second logical address into the second physical address.

BRIEF DESCRIPTION OF THE DRAWINGS

FIG. 1 is a diagram illustrating a schematic configuration example of a memory module according to an embodiment of the present disclosure.
FIG. 2 is a diagram illustrating a schematic configuration example of each 3DXP package in FIG. 1.
FIG. 3 is a diagram illustrating a schematic configuration example of a 3DXP die in FIG. 2.
FIG. 4 is a diagram illustrating a schematic configuration example of each bank in FIG. 3.
FIG. 5 is a diagram illustrating a schematic configuration example of each tile in FIG. 4.
FIG. 6 is an enlarged perspective view of a schematic configuration example of a memory cell array in FIG. 5.
FIG. 7 is a diagram illustrating an operational example of the memory cell array in FIG. 6.
FIG. 8 is a diagram illustrating a functional block example of the memory module in FIG. 1.
FIG. 9 is a diagram illustrating an example of a sector which is a unit for performing encoding/decoding of ECC or XOR parity.
FIG. 10 is a diagram illustrating a configuration example of pins provided in respective 3DXP packages in FIG. 1.
FIG. 11 is a diagram illustrating an example of signals to be inputted to address bus terminals of two systems in FIG. 10.
FIG. 12 is a diagram illustrating an example of a read operation in a 3DXP package group in FIG. 1.

FIG. 13 is a diagram illustrating an example of a read operation and a write operation in the 3DXP package group in FIG. 1.

FIG. 14 is a diagram illustrating an example of two-tier ECC codewords.

FIG. 15 is a diagram illustrating a functional block example of a circuit that performs data reading using two-tier ECC codewords.

FIG. 16 is a diagram illustrating a functional block example of a circuit that performs data writing using two-tier ECC codewords.

FIG. 17 is a diagram illustrating an example of arrangement of two-tier ECC codewords.

FIG. 18 is a diagram illustrating an example of arrangement of two-tier ECC codewords.

FIG. 19 is a diagram illustrating an example of latency in the memory module in FIG. 1.

FIG. 20 is a diagram illustrating an example of latency in the memory module in FIG. 1.

MODES FOR CARRYING OUT THE INVENTION

Hereinafter, description is given in detail of modes for carrying out the present disclosure with reference to the drawings. However, embodiments described below are merely exemplary, and there is no intention of excluding application of various modifications and technologies not explicitly described below. The present technology can be implemented by making modifications in a wide variety of ways (e.g., combining embodiments, etc.) in a range not deviating from the gist of the present technology. In addition, in the following description of the drawings, the same or similar portions are denoted by the same or similar reference numerals. The drawings are schematic, and do not necessarily correspond to actual dimensions, proportions, or the like. The drawings may also include portions in which dimensional relationships or proportions differ from each other.

[Configuration]

FIG. 1 illustrates a schematic configuration example of a memory module 200 according to an embodiment of the present disclosure. The memory module 200 includes, for example, a controller 210, a DRAM 220, and a 3DXP package group 230. The DRAM 220 is provided separately from the controller 210 and the 3DXP package group 230. The DRAM 220 holds Column address lookup information 221 which is mapping information indicating a correspondence relationship between a Column address, which is a portion of a physical address, and a logical address. The controller 210 incorporates a SRAM 211. The SRAM 211 holds Row address lookup information 211A which is mapping information indicating a correspondence relationship between a Row address, which is a portion of a physical address, and a logical address.

The SRAM 211 corresponds to a specific example of a "first storage section" of the present disclosure. The DRAM 220 corresponds to a specific example of a "second storage section" of the present disclosure. The Row address corresponds to a specific example of a "first physical address" of the present disclosure. The Column address corresponds to a specific example of a "second physical address" of the present disclosure. The Row address lookup information 211A and the Column address lookup information 221 each correspond to a specific example of "address lookup information" of the present disclosure. The Row address lookup information 211A corresponds to a specific example of "first address lookup information" of the present disclosure. The Column address lookup information 221 corresponds to a specific example of "second address lookup information" of the present disclosure.

The 3DXP package group 230 stores user data and various types of control data inputted from a host computer 100. The control data may include, for example, metadata, address management data, error correction data, and the like. The 3DXP package group 230 includes, for example, a plurality of (e.g., 11) 3DXP packages 230-$i$ (1≤i≤x). The 3DXP package 230-$i$ corresponds to a specific example of a "non-volatile memory" of the present disclosure. As illustrated in FIG. 2, the 3DXP package 230-$i$ includes, for example, a plurality of (e.g., four) 3DXP dies 230-$j$ (1≤j≤y). As illustrated in FIG. 3, each of the 3DXP dies 230-$j$ includes, for example, a plurality of (e.g., 16) banks 232-$k$ (1≤k≤z), a Periphery circuit 233 that controls access to each of the banks 232-$k$, and an interface circuit 234 that communicates with the controller 210. As illustrated in FIG. 4, each of the banks 232-$k$ includes, for example, tiles 235 that each include memory cell arrays each including a 1-bit access unit (e.g., memory cell array including a 32 B-bit memory cell MC), and a microcontroller 236 that controls these tiles 235. Under the control of the microcontroller 236, each of the banks 232-$k$ operates a group of the tiles 235 in a coordinated manner to achieve access to a data block of a predetermined byte size (e.g., 32 bytes) as a whole.

As illustrated in FIGS. 5 and 6, each of the tiles 235 includes, for example, a memory cell array 241 including memory cell arrays 241$a$ and 241$b$ of two layers. As illustrated in FIG. 6, each of the memory cell arrays 241$a$ and 241$b$ includes, for example, a 1-bit memory cell MC at each intersection point of an upper word line UWL and a bit line BL, and at each intersection point of a lower word line LWL and the bit line BL. The memory cell MC is a writable non-volatile memory. The memory cell MC has a series structure of a resistance change element VR (Variable Resistor) and a selector element SE (Selector Element). The resistance change element VR records 1-bit information depending on a state of high and low of a resistance value, and the selector element SE has bidirectional diode characteristics. Hereinafter, a word line WL is appropriately used as a generic term for the upper word line UWL and the lower word line LWL.

As illustrated in FIG. 5, each of the tiles 235 includes, for example, a WL driver 242, a BL driver 243, an R/W voltage switch 244, an R/W latch 245, and a sense amplifier 246.

On the basis of a control signal (a word line address WLA) by the microcontroller 236, the WL driver 242 applies a predetermined voltage to each word line WL. A voltage Vinh_wl (e.g., 0 V) to be given to a non-selected word line WL is inputted to the WL driver 242. On the basis of a control signal (a bit line address BLA) by the microcontroller 236, the BL driver 243 selects a plurality of bit lines BL from among a plurality of bit lines BL. A voltage Vinh_bl (e.g., 0 V) to be given to a non-selected bit line BL is inputted to the BL driver 243.

On the basis of a control signal Ctrl by the microcontroller 236 and write data WDATA by the R/W latch 245, the R/W voltage switch 244 switches voltages of nodes GWL and GBL to which selected word line WL and bit line BL are coupled. The R/W latch 245 outputs the write data WDATA inputted from the Periphery circuit 233 and the interface circuit 234 to the RAY voltage switch 244. The R/W latch 245 further outputs read data RDATA inputted from the sense amplifier 246 to the Periphery circuit 233 and the interface circuit 234. On the basis of the control signal Ctrl by the microcontroller 236, the sense amplifier 246 compares a voltage of the node GWL obtained from the WL driver 242 with Vref (e.g., about −1V) to determine whether the resistance change element VR is in a low-resistance state (LRS) or in a high-resistance state (HRS). The sense amplifier 246 generates logic zero in a case where the resistance change element VR is in the low-resistance state (LRS), and logic one is generated in a case where the resistance change element VR is in the high-resistance state (HRS), thereby generating the read data RDATA. The sense amplifier 246 outputs the generated read data RDATA to the R/W latch 245.

FIG. 7 illustrates I-V characteristics in the memory cell MC. Suppose that, when the resistance change element VR is in the low-resistance state (LRS), a voltage across the memory cell MC is swept from 0 V. At this time, in a case where the voltage across the memory cell MC drops at 4 V to cause a current to abruptly flow into the memory cell MC, this phenomenon is called snap, and a snap voltage Vth_LRS is 4 V. When the resistance change element VR is in the high-resistance state (HRS), the snap voltage Vth_HRS becomes higher than the snap voltage Vth_LRS, and reaches 6 V, for example. When 5 V is applied to the memory cell MC of which a state is desired to be known, the resistance change element VR is snapped when the resistance change element VR is in the low-resistance state (LRS), whereas the resistance change element VR is not snapped when the resistance change element VR is in the high-resistance state (HRS). Accordingly, discerning whether the snap is present or absent makes it possible to achieve the reading from the memory cell MC. When the resistance change element VR is in the high-resistance state (HRS), by snapping the resistance change element VR to flow a current of about 50 µA into the memory cell MC in a predetermined direction, the resistance change element VR changes into the low-resistance state (LRS). When the resistance change element VR is in the low-resistance state (LRS), by snapping the resistance change element VR to flow a current of about 30 µA into the memory cell MC in a predetermined direction, the resistance change element VR changes into the high-resistance state (HRS). Combination of the above-described reading and change in resistance of the resistance change element VR makes it possible to achieve the writing into the memory cell MC.

In a case of reading the memory cell MC, for example, the tile 235 charges a lower word line LWL0 to −2.5 V, and then brings it into a floating state. Further, for example, the tile 235 applies +2.5 V to a bit line BL0. As a result, when the resistance change element VR of the memory cell MC at an intersection of the lower word line LWL0 and the bit line BL0 is in the low-resistance state (LRS), the resistance change element VR is snapped to discharge a parasitic capacitance of the lower word line LWL0, thus causing a potential of the lower word line LWL0 to rise to around 0 V. When the resistance change element VR of the memory cell MC at the intersection of the lower word line LWL0 and the bit line BL0 is in the high-resistance state (HRS), the resistance change element VR is not snapped to cause only a slight leakage current to flow to the lower word line LWL0, and thus the potential of the lower word line LWL0 is kept around −2 V. At this time, for example, the tile 235 compares the potential of the lower word line LWL0 with the Vref (e.g., about −1 V) by using the sense amplifier 246 to determine whether the resistance change element VR is in the low-resistance state (LRS) or in the high-resistance state (HRS). For example, the tile 235 generates logic zero in a case where the resistance change element VR is in the low-resistance state (LRS), and generates logic one in a case where the resistance change element VR is in the high-resistance state (HRS), thereby generating the read data RDATA. For example, the tile 235 outputs the generated read data RDATA to the Periphery circuit 233.

(Pre-Read)

In a case of writing into the memory cell MC, for example, the tile 235 determines a current state of the resistance change element VR, and compares the read data RDATA obtained as a result of the determination and the write data WDATA with each other. For example, the tile 235 sets Set Verify Latch to one when the resistance change element VR is in the high-resistance state (HRS) (=logic zero) and a value desired to be written is one. For example, the tile 235 sets Reset Verify Latch to one when the resistance change element VR is in the low-resistance state (LRS) (=logic one) and the value desired to be written is zero. For example, the tile 235 sets the Set Verify Latch and the Reset Verify Latch to zero when the resistance change element VR is in the high-resistance state (HRS) (=logic zero) and the value desired to be written is zero. For example, the tile 235 sets the Set Verify Latch and the Reset Verify Latch to zero when the resistance change element VR is in the low-resistance state (LRS) (=logic one) and the value desired to be written is one.

(Set)

For example, when the Set Verify Latch is one, the tile 235 applies +3.5 V to the bit line BL0 and applies −3.5 V to the lower word line LWL0. This causes the resistance change element VR of the memory cell MC at the intersection of the lower word line LWL0 and the bit line BL0 to change from the high-resistance state (HRS) to the low-resistance state (LRS). In this manner, the memory cell MC is set. For example, when the Set Verify Latch is zero, the tile 235 does nothing for the memory cell MC at the intersection of the lower word line LWL0 and the bit line BL0.

(Reset)

For example, when the Set Verify Latch is one, the tile 235 applies −3.0 V to the bit line BL0 and applies +3.0 V to the lower word line LWL0. This causes the resistance change element VR of the memory cell MC at the intersection of the lower word line LWL0 and the bit line BL0 to change from the low-resistance state (LRS) to the high-resistance state (HRS). In this manner, the memory cell MC is reset. For example, when the Set Verify Latch is zero, the tile 235 does nothing for the memory cell MC at the intersection of the lower word line LWL0 and the bit line BL0.

(Verify)

For example, the tile 235 determines a state of the resistance change element VR after the reset, and again compares the read data RDATA obtained as a result of the determination and the write data WDATA with each other. On the basis of a result of the comparison, for example, the tile 235 sets values of the Set Verify Latch and the Reset Verify Latch in a manner similar to that for Pre-read. For example, when both the values of the Set Verify Latch and the Reset Verify Latch are zero, the tile 235 determines the write to be successful. For example, when one of the values of the Set Verify Latch and the Reset Verify Latch is one, the tile 235 determines the write to be failed, and again executes the Set operation, the Reset operation, and the Verify operation. This sequence of operations is called a Verify Loop.

FIG. 8 illustrates in detail an internal configuration example of the controller 210 in the memory module 200. For each data unit accessed by the host computer 100, a data unit handled by each of the banks 232-$k$ included in the 3DXP package 230-$i$ is very small, and is 32 bytes, for example. In order to meet a request (in particular, read request) of the host computer 100 with minimal delay, the controller 210 distributes access granularity of the host computer 100 to a plurality of banks 232-$k$ for reading and writing. For the purpose of ensuring data reliability, and the like (including, e.g., refreshing to suppress occurrence of read errors and Wear-Leveling processing to suppress wear), the controller 210 performs reading and writing, which do not depend on Read/Write requests of the host computer 100, on the 3DXP package 230-$i$ periodically or for every predetermined access. This is called BG (background) Read/Write. It is to be noted that the Read/Write requested by the host computer 100 is referred to as FG (foreground) Read/Write to distinguish it from the BG Read/Write. For example, as for the FG Write having granularity less than a data unit (e.g., 256 bytes) handled by one bank 232-$k$ of each 3DXP package 230-$i$, for example, the controller 210 first reads existing data from each 3DXP package 230-$i$, partially rewrites the read data (read data), and writes data generated by the rewriting (write data) into each 3DXP package 230-$i$.

For example, the controller 210 is provided one by one for each 3DXP package 230-$i$, and includes a plurality of (e.g., eleven) interface sections 219-$i$ (1≤$i$≤x) that communicates with the 3DXP package 230-$i$, and a DRAM interface section 212 that controls communication with the DRAM 220. The controller 210 further includes, for example, an ECC control section 218, an ECP control section 217, an XOR control section 216, a CRC & address check section 215, a write buffer section 214, and a wear-leveling (Wear-Leveling) section 213. Functions of each component are described in detail when describing functions of the controller 210.

FIG. 9 illustrates an example of a sector which is a unit for performing encoding/decoding of ECC or XOR parity.

For example, the host computer 100 transmits 256-byte user data and 8-byte metadata to the controller 210. The metadata is information for data management typically used in a memory system for enterprises, and includes, for example, address information, CRC checksums used by the host computer 100, version numbers, time stamps, and the like. For example, the controller 210 records, in the 3DXP package 230-$i$, 264-byte user data received from the host computer 100, with a 4-byte logical address added thereto. There are two objectives: the first is to restore address lookup on the DRAM 220 and the SRAM 211, from which recorded data results in being deleted at the time of power shutoff, when recovering (restarting) from the power shutoff, by recording the logical address in the 3DXP package 230-$i$ for each writing; and the second is to check that a correct address is accessible when reading.

The 4-byte logical address may be data obtained by bit-by-bit acquisition of XOR using a 32-bit CRC generated by a data part (256-byte user data, 8-byte metadata) in the sector and a logical address. The controller 210 uses the data part (256-byte user data, 8-byte metadata) in the sector and the 4-byte logical address as payloads to generate 45-byte ECC parity on the basis of a BCH code. There are two objectives of the ECC parity: the first is to correct bit errors that occur randomly in a transmission path via the interface section or the like when writing into the 3DXP package 230-$i$; and the second is to tolerate occurrence of a bit failure up to a predetermined number of bits and to ensure data reliability by error correction at the time of reading when writing into a 3DXP memory 230-$i$ and when the bit failure occurs accidentally or due to wear.

In a case where there are a predetermined number or more of write failures in the sector, the controller 210 further generates an ECP (Error-Correction Pointer) indicating the position of a failure bit, and adds to the sector a bit sequence to be originally written into the failure position indicated by the ECP as a 7-byte patch. The controller 210 further generates 32-byte XOR parity by an XOR operation on the basis of a 320-byte codeword including user data, metadata, a logical address, ECC parity, and a patch. The controller 210 records the XOR parity in a channel different from a channel that records user data in the sector. For example, the controller 210 records the user data and the XOR parity in locations different from each other in channel numbers, die IDs, and bank addresses in the 3DXP package group 230.

The XOR parity is a data protective means similar to RAID5 to be used in HDD (Hard Disk Drive) or SSD (Solid State Drive). An objective of the XOR parity is to prevent data loss even when one of the plurality of (e.g., 11-channel) 3DXP packages 230-$i$ loses all bits due to accidental breakdown or the like. The ECC and the ECP are able to cope with a failure in a unit of bits, but are not able to cope with a breakdown in large granularity as described above. Providing the XOR parity makes it possible to perform decoding into correct data on the basis of data read from other channels that are not broken down (e.g., 3DXP packages 230-$i$ of other ten channels). Further, providing the XOR parity enables Serial/Parallel Schedulling described later, thus making it possible to contribute greatly to low latency performance. The controller 210 sets the above-described total of 352 bytes as one sector, divides the sector into 11 pieces of 32 bytes each, and records, in the 3DXP packages 230-$i$, the 11 *pieces of* 32-byte data obtained by the division via different interface sections.

FIG. 10 illustrates a configuration example of pins provided in respective 3DXP packages 230-$i$. Each 3DXP package 230-$i$ is provided with address bus terminals of two systems; for example, four address bus terminals (ca1) are provided for one system, and, for example, two address bus terminals (ca2) are provided for another system. The address bus terminal ca1 corresponds to a specific example of a "first address bus terminal" of the present disclosure. The address bus terminal ca2 corresponds to a specific example of a "second address bus terminal" of the present disclosure.

For example, as illustrated in FIG. 11, the controller 210 transmits a die ID, a command, a bank address, and a Row address to each 3DXP package 230-$i$ in a plurality of clock cycles (e.g., six clock cycles (6 ns)) via the address bus terminal (ca1). For example, as illustrated in FIG. 11, the controller 210 transmits parity and a Colomn address to each 3DXP package 230-$i$ in a plurality of clock cycles (e.g., six clock cycles (6 ns)) via the address bus terminal (ca2).

For example, as illustrated in FIG. 10, the controller 210 further includes a control pin common to the address bus terminals (ca1) of two 3DXP packages 230-$i$ in the 3DXP package group 230. That is, the controller 210 transmits data (die ID, command, bank address, and Row address) to the address bus terminals (ca1) of the two 3DXP packages 230-$i$ in the 3DXP package group 230 via the common control pin. For example, the controller 210 may simultaneously transmit the same data (die ID, command, bank address, and Row address) to the address bus terminals (ca1) of the two 3DXP packages 230-$i$ in the 3DXP package group 230. For example, the controller 210 may transmit data for one 3DXP package 230-$i$ (die ID, command, bank address, and Row address) to the address bus terminals (ca1) of the two 3DXP packages 230-$i$ in the 3DXP package group 230, and then may transmit data for another 3DXP package 230-$i$ (die ID, command, bank address, and Row address).

For example, as illustrated in FIG. 10, the controller 210 further includes a control pin common to the address bus terminals (ca2) of two 3DXP packages 230-$i$ in the 3DXP package group 230. That is, the controller 210 transmits data (parity and Colomn address) to the address bus terminals (ca2) of the two 3DXP packages 230-$i$ in the 3DXP package group 230 via the common control pin. For example, the controller 210 may simultaneously transmit the same data (parity and Colomn address) to the address bus terminals (ca2) of the two 3DXP packages 230-$i$ in the 3DXP package group 230. For example, the controller 210 may transmit the data for the one 3DXP package 230-$i$ (die ID, command, bank address, and Row address) to the address bus terminals (ca1) of the two 3DXP packages 230-$i$ in the 3DXP package group 230, and then may transmit data for one 3DXP package 230-$i$ (parity and Colomn address) to the address bus terminals (ca2) of the two 3DXP packages 230-$i$ in the 3DXP package group 230. For example, the controller 210 may transmit the data for the other 3DXP package 230-$i$ (die ID, command, bank address, and Row address) to the address bus terminals (ca1) of the two 3DXP packages 230-$i$ in the 3DXP package group 230, and then may transmit data for another 3DXP package 230-$i$ (parity and Colomn address) to the address bus terminals (ca2) of the two 3DXP packages 230-$i$ in the 3DXP package group 230.

As illustrated in FIG. 11, transmitting data in the form of a packet to each 3DXP package 230-$i$ makes it possible to reduce the number of pins of each 3DXP package 230-$i$, for example, as compared with the case where separate pins are used to transmit the die ID, the command, the bank address, the Row address, the parity, and the Row address to each 3DXP package 230-$i$. In addition, upon accessing a plurality of dies 231-$j$ and the plurality of banks 232-$k$ in parallel, it is possible to avoid collision of transmission timings of the Row address and the Column address, which may lead to lowered efficiency in data transmission.

FIG. 12 illustrates an example of a read operation in the 3DXP package group 230. The controller 210 holds, on the DRAM 220, the Column address lookup information 221 which is mapping information indicating a correspondence relationship between the Column address, which is a portion of the physical address, and the logical address. The controller 210 also holds, on the SRAM 211 incorporated in the controller 210, the Row address lookup information 211A which is mapping information indicating a correspondence relationship between the Row address, which is a portion of the physical address, and the logical address.

In each 3DXP package 230-$i$, the limit of the number of times of rewriting is smaller (i.e., finite) than that of the DRAM, and thus address conversion is necessary to level wear due to repeated rewriting. Therefore, the controller 210 refers to the Column address lookup information 221 on the DRAM 220 at a predetermined timing (e.g., for each Read), and changes the Column address lookup information 221 on the basis of a predetermined algorithm. The controller 210 uses the changed Column address lookup information 221 to perform the address conversion.

When receiving a read command including a logical address from the host computer 100, the controller 210 uses the Column address lookup information 221 and the Row address lookup information 211A to convert the logical address included in the read command into a physical address. The controller 210 inputs a Row address, which is a portion of the physical address obtained by the conversion, to each 3DXP package 230-$i$ via one address bus terminal (ca1). The controller 210 then inputs the Column address, which is the rest of the physical address obtained by the conversion, to each 3DXP package 230-$i$ via another address bus terminal (ca2). This allows the controller 210 to read data corresponding to the physical address obtained by the conversion from each 3DXP package 230-$i$.

For example, as illustrated in FIG. 12, when receiving a read command including a logical address from the host computer 100, the controller 210 reads the Row address lookup information 211A from the SRAM 211, and converts a portion of the logical address to a Row address on the basis of the read Row address lookup information 211A. The controller 210 inputs the Row address or the like obtained by the conversion to each 3DXP package 230-$i$ via the address bus terminal (ca1). Each 3DXP package 230-$i$ decodes the Row address or the like inputted via the address bus terminal (ca1), and sets it in the memory cell array 241.

Within a period (e.g., 20 ns+50 ns) in which each 3DXP package 230-$i$ decodes the Row address or the like to statically determinate a WL voltage of the memory cell array 241, the controller 210 reads the Column address lookup information 221 from the DRAM 220, and converts a portion of the logical address into a Column address on the basis of the read Row address lookup information 211A. The controller 210 inputs the Column address or the like obtained by the conversion to each 3DXP package 230-$i$ via the address bus terminal (ca2). The controller 210 inputs the Column address or the like to each 3DXP package 230-$i$ via the address bus terminal (ca2) in a predetermined period (e.g., 50 ns later) from the time when the Row address or the like is inputted to each 3DXP package 230-$i$ via the address bus terminal (ca1). Each 3DXP package 230-$i$ decodes the Column address or the like inputted via the address bus terminal (ca2), and sets the Row address or the like in the memory cell array 241. Subsequently, each 3DXP package 230-$i$ statically determinates the WL voltage of the memory cell array 241. That is, a period (e.g., 50 nm+20 nm) necessary for the controller 210 to read the Column address lookup information 221 from the DRAM 220 or for each 3DXP package 230-$i$ to decode the Column address or the like falls within the period (e.g., 20 ns+50 ns) in which each 3DXP package 230-$i$ decodes the Row address or the like to statically determinate the WL voltage of the memory cell array 241.

Accordingly, even in consideration of processing (e.g., 20 ns) in the sense amplifier 246, processing (e.g., 30 ns) in the R/W latch 245, and processing (e.g., 20 ns) to decode read data inputted from the RAY latch 245 in the controller 210, time (read latency) required for the host computer 100 to read data from the memory module 200 can be reduced to time (e.g., 200 ns) equal to or shorter than an average read latency (about 300 ns) of the DRAM.

(Wear-Leveling)

In the Column address lookup information 221 stored in the DRAM 220, a 8-kbyte section serves as a unit of conversion. At this time, the conversion unit (e.g., 8-kbyte section) of the Column address lookup information 221 is: a data unit (e.g., 32 bytes) upon accessing one bank 232-$k$ of one die 231-$j$ through one channel (3DXP package 230-$i$)× the number of the 3DXP packages 230-$i$ (i.e., the number of channels) (e.g., eleven channels) included in the 3DXP package group 230×the number of sectors (e.g., 32 sectors) belonging to the same die 231-$j$. In the 3DXP package group 230, each one bit of the 32 sectors included in the 8-kbyte section is recorded in 32 memory cells MC on the same row (word line WL). The reason why the memory cells MC on the same row (word line WL) are to be recorded in this manner is because address information obtained from the Row address lookup information 211A of the SRAM 211 is a Row address. In addition, the reason why the 32 sectors are combined as one batch is because a DRAM capacity necessary for the Column address lookup information 221 is a realistic value (e.g., less than 4 Gb).

The controller 210 may define a block for each of 128 sections (e.g., 512 kbytes) in the Column address lookup information 221 to perform counter-based inter-block swapping. The controller 210 includes, for example, a plurality of counters assigned one by one to respective blocks; when any one of the counters exceeds a predetermined threshold, the controller 210 may perform address conversion on a block corresponding to the counter having exceeded the predetermined threshold on the basis of a predetermined algorithm. It is to be noted that the controller 210 may refer to, for example, the Column address lookup information 221 on the DRAM 220 at a predetermined timing (e.g., for each Read) to perform address conversion on the Column address lookup information 221 on the basis of the predetermined algorithm.

Here, in the 3DXP package group 230, each one bit of 4096 sectors included in the 128 sections belonging to the block is recorded in 4096 memory cells MC on the same Row (word line WL). Suppose that, in one tile 235, for example, 4096 bit lines BL cross one word line WL, and the memory cells MC are provided at respective intersections. In this case, in the one tile 235, there are only 4096 memory cells MC on the same Row (word line WL). Accordingly, in this case, a block size is required to be defined as 512 kbytes or less. A larger block size enables a SRAM capacity necessary for the Row address lookup information 211A to be smaller; thus, the block size is preferably the sum of the sizes of memory cells MC (e.g., 512 kbytes) provided on the same Row (word line WL) in the one tile 235.

The 3DXP package group 230 has a capacity size of 704 Gbytes when a capacity size per the 3DXP package 230-$i$ is 64 Gbytes. Among the 704 Gbytes, a capacity size to be used for recording user data is 512 Gbytes, and the rest thereof is assumed to be used for parity, or the like. At this time, the number of blocks included in the 3DXP package group 230 is: 512 Gbytes/512 kbytes=1 M; when the block address is specified by 20 bits, the block address has a table size of: 20 bits×1 M=2.5 Mbytes. In the case of High Density 6-transistor SRAM of 14 nm logic process, the capacity of 2.5 Mbytes is about 2 mm×about 2 mm, which is achievable. Accordingly, a SRAM storing a table of block addresses is implementable in the controller 210.

(Read/Write)

FIG. 13 illustrates an example of a read operation and a write operation in the 3DXP package group 230. In order to minimize time required for writing as short as possible, the controller 210 distributes and writes all pieces of write data including user data into a plurality of 3DXP packages 230-$i$, instead of writing them into one 3DXP package 230-$i$. When receiving a write command including user data, the controller 210 distributes and writes write data including the received user data into the plurality of 3DXP packages 230-$i$. When receiving the write command including the user data, for example, the controller 210 distributes and writes write data of one sector (352 bytes) including the received user data into eleven 3DXP packages 230-$i$ of 32 bytes each, for example.

In addition, in order to minimize time required for reading as short as possible, the controller 210 reads 32-byte data distributed and written into the plurality of 3DXP packages 230-$i$ from the plurality of 3DXP packages 230-$i$, instead of reading all pieces of read data including the user data from one 3DXP package 230-$i$. For example, the controller 210 reads the 32-byte data distributed and written into the eleven 3DXP packages 230-$i$ from the eleven 3DXP packages 230-$i$.

The controller 210 performs, for example, parallel write for writing into the plurality of 3DXP packages 230-$i$ at the same timing upon writing. The controller 210 performs, for example, parallel read for reading from the plurality of 3DXP packages 230-$i$ at the same timing upon reading. It is to be noted that the controller 210 may perform, for example, serial write for sequentially writing 32-byte data into the plurality of 3DXP packages 230-$i$ as needed upon writing. The controller 210 may perform, for example, serial read for sequentially reading the 32-byte data distributed and written into the plurality of 3DXP packages 230-$i$ from the plurality of 3DXP packages 230-$i$ as required upon reading. Hereinafter, the above-mentioned parallel write, parallel read, serial write, and serial read are described in detail.

For example, as illustrated in (1) in FIG. 13, when receiving a write request including 256-byte user data from the host computer 100, the controller 210 generates write data of one sector including the 256-byte user data, and distributes and writes the generated write data of one sector in ten channels (ten 3DXP packages 230-$i$) of 32 bytes each on a channel-by-channel basis, for example, so as not to allow pieces of busy of a plurality of channels to overlap each other (serial write). At this time, it takes time of 1.2 $\mu$s×11 ch=13.2 $\mu$s, for example, for writing of the write data of one sector.

For example, as illustrated in (2) in FIG. 13, when receiving a read request of the user data from the host computer 100, the controller 210 reads, from ten channels (ten 3DXP packages 230-$i$) excluding a channel (3DXP package 230-$i$) being written (Busy), pieces of data (e.g., 320-byte data) of the ten channels (ten 3DXP packages 230-$i$) among sectors, to which addresses included in the read request belong, at the same timing (parallel read). That is, when receiving a read command in the middle of performing the serial write, the controller 210 performs parallel read for reading data in a data unit including a data storage region corresponding to a logical address included in the received read command, excluding the data obtained from a channel (3DXP package 230-$i$) being busy by the serial write, from the plurality of channels (3DXP packages 230-$i$) excluding the channel (3DXP package 230-$i$) being busy by the serial write, among the plurality of channels (3DXP packages 230-$i$).

Subsequently, for example, the controller 210 restores data (e.g., 32-byte data) having been scheduled to be read from the channel (3DXP package 230-$i$) being written (Busy), by using 32-byte XOR parity included in 10 pieces of data read from the ten channels. That is, for example, the controller 210 restores the data (e.g., 32-byte data) having been scheduled to be read from the channel (3DXP package 230-$i$) being written (Busy), by using XOR parity included in data obtained by performing the parallel read. Subsequently, for example, the controller 210 extracts data corresponding to the address included in the read request from data including the data obtained by the restoration, and transmits the extracted data to the host computer 100.

For example, as illustrated in (3) in FIG. 13, when a predetermined condition is satisfied, the controller 210 reads data of one sector including the 256-byte user data without being requested from the host computer 100 (i.e., in the background). For example, as illustrated in (3) in FIG. 13, the controller 210 reads data to be read from eleven channels (eleven 3DXP packages 230-*i*) of 32 bytes each on a channel-by-channel basis, for example, so as not to allow pieces of busy of a plurality of channels to overlap each other (serial read). That is, the controller performs serial read for reading data in a data unit including a data storage region corresponding to a predetermined address from the plurality of channels (3DXP packages 230-*i*) so as not to allow pieces of busy of a plurality of non-volatile memories to overlap each other.

For example, suppose, as illustrated in (4) in FIG. 13, that the controller 210 receives a write request including 64-byte user data from the host computer 100 in the middle of performing background read (BG Read) in (3) in FIG. 13. At this time, for example, as illustrated in (4) in FIG. 13, the controller 210 reads, from ten channels (ten 3DXP packages 230-*i*) excluding the channel (3DXP package 230-*i*) being written (Busy), pieces of data (e.g., 320-byte data) of the ten channels (ten 3DXP packages 230-*i*) among sectors, to which addresses included in the write request belong, at the same timing (parallel read). That is, when receiving a write command including the user data in the middle of performing the serial read, the controller performs parallel read for reading data in a data unit including a data storage region into which the received user data is scheduled to be written, excluding the data obtained from the channel (3DXP package 230-*i*) being busy by the serial read, from the plurality of channels (3DXP packages 230-*i*) excluding the channel (3DXP package 230-*i*) being busy by the serial read, among the plurality of channels (3DXP packages 230-*i*).

Subsequently, for example, the controller 210 restores data (e.g., 32-byte data) having been scheduled to be read from the channel (3DXP package 230-*i*) being read (Busy), by using 32-byte XOR parity included in 10 pieces of data read from the ten channels (ten 3DXP packages 230-*i*). Subsequently, for example, the controller 210 overwrites the 64-byte data corresponding to an address included in the write request among data of one sector including the data obtained by the restoration, with the 64-byte user data received from the host computer 100. Subsequently, for example, the controller 210 distributes and writes the data of one sector obtained by the overwriting, into 32 bytes each on a channel-by-channel basis, for example, so as not to allow pieces of busy of a plurality of channels to overlap each other (serial write). That is, for example, the controller 210 restores data (e.g., 32-byte data) having been scheduled to be read from the channel (3DXP package 230-*i*) being read (Busy), by using the XOR parity included in data obtained by performing the parallel read, and overwrites the data including the data obtained by the restoration with the received user data. Then, the controller 210 distributes and writes the resulting data into the plurality of channels (3DXP packages 230-*i*).

For example, suppose, as illustrated in (5) in FIG. 13, that the controller 210 receives a write request including 128-byte user data from the host computer 100 in the middle of performing the serial write in (4) in FIG. 13. At this time, for example, as illustrated in (5) in FIG. 13, the controller 210 reads, from ten channels (ten 3DXP packages 230-*i*) excluding the channel (3DXP package 230-*i*) being written (Busy), pieces of data (e.g., 320-byte data) of the ten channels (ten 3DXP packages 230-*i*) among sectors, to which addresses included in the write request belong, at the same timing (parallel read). Subsequently, for example, the controller 210 restores data (e.g., 32-byte data) having been scheduled to be read from the channel (3DXP package 230-*i*) being written (Busy), by using 32-byte XOR parity included in 10 pieces of data read from the ten channels. Subsequently, for example, the controller 210 overwrites the 128-byte data corresponding to an address included in the write request among data of one sector including the data obtained by the restoration, with the 64-byte user data received from the host computer 100. Subsequently, for example, the controller 210 distributes and writes the data of one sector obtained by the overwriting, into eleven channels (eleven 3DXP packages 230-*i*) of 32 bytes each on a channel-by-channel basis, for example, so as not to allow pieces of busy of a plurality of channels to overlap each other (serial write).

For example, suppose, as illustrated in (6) in FIG. 13, that the controller 210 receives a write request including 256-byte user data from the host computer 100 in the middle of performing the serial write in (5) in FIG. 13. At this time, for example, as illustrated in (6) in FIG. 13, the controller 210, after generation of write data of one sector including the 256-byte user data, may suspend the serial write being already executed to write the generated write data of one sector at the same timing (parallel write).

Incidentally, as illustrated in FIG. 8, for example, the controller 210 includes the write buffer section 214. The write buffer section 214 is a buffer for storing data slated to be written when receiving a write request from the host computer 100. For example, as illustrated in (6) in FIG. 13, in the case of receiving the write request including the 256-byte user data, when the write buffer section 214 does not have sufficient free space for the received data (e.g., when the free space of the write buffer section 214 exceeds a predetermined threshold), the controller 210 preferably suspends the serial write being already executed to write the write data of one sector at the same timing. Meanwhile, in the case of receiving the write request including the 256-byte user data, for example, when the write buffer section 214 has sufficient free space for the received data, the controller 210 preferably writes the write data of one sector at the same timing after completion of the serial write being executed.

The free space of the write buffer section 214 is managed, for example, by an unwritten data amount Que provided in the write buffer section 214. For example, the controller 210 increases a numerical value of the unwritten data amount Que each time a write request from the host computer 100 is received, in accordance with an amount of the received data, and decreases the numerical value of the unwritten data amount Que each time writing in response to a write request is finished, in accordance with an amount of data of which writing has been finished. When the numerical value of the unwritten data amount Que exceeds a predetermined threshold, for example, the controller 210 determines that the write buffer section 214 does not have sufficient free space, and suspends the serial write being executed to execute new write processing in parallel write. For example, in a case where the numerical value of the unwritten data amount Que does not exceed the predetermined threshold, the controller 210 determines that the write buffer section 214 has sufficient free space, and executes new write processing after completion of the serial write being executed.

(ECC Codeword)

In the present embodiment, the controller 210 performs error correction using two-tier ECC codewords upon writing data into the 3DXP package group 230 or reading data from the 3DXP package group 230.

FIG. 14 illustrates an example of two-tier ECC codewords. FIG. 15 illustrates a functional block example of a circuit that performs data reading using the two-tier ECC codewords. FIG. 15 exemplifies a functional block example at the time when reading data from any ten channels of eleven channels. FIG. 16 illustrates a functional block example of a circuit that performs data writing using the two-tier ECC codewords.

(Two-Tier ECC Codeword)

Among the two-tier ECC codewords, a codeword (ECC1 codeword) of a smaller size includes parity enabling error correction of a relatively low number of bits. The ECC1 codeword includes, for example, ECC1 parity enabling error correction of an error up to 2 bits. The ECC1 codeword is, for example, 286-bit data configured by 32-byte user data, 1-byte metadata, 4-bit logical address, and 18-bit ECC1 parity. The 18-bit ECC1 parity enables error correction of an error up to 2 bits in the ECC1 codeword. An ECC2 codeword includes parity enabling error correction of a relatively high number of bits. The ECC2 codeword includes, for example, ECC2 parity enabling error correction of an error up to 5 bits. The ECC2 codeword is configured by, for example, eight ECC1 codewords (ECC1 codeword A to ECC1 codeword H) and 278-byte ECC2 parity. The 278-byte ECC2 parity enables error correction of an error up to 5 bits in the ECC2 codeword.

(Data Reading)

For example, as illustrated in FIG. 15, the controller 210 includes the XOR control section 216, the ECP control section 217, the ECC control section 218 including eight ECC1 decoders and one ECC2 decoder, the CRC & address check section 215, and a separation section 222.

The XOR control section 216 has a function of an XOR decoder. When receiving a read request of user data from the host computer 100, the XOR control section 216 reads, from ten channels (ten 3DXP packages 230-*i*) excluding a channel (3DXP package 230-*i*) being written (Busy), pieces of data (e.g., 320-byte data) of the ten channels (ten 3DXP packages 230-*i*) among sectors, to which addresses included in the read request belong, at the same timing (parallel read).

The XOR control section 216 restores data (e.g., 32-byte data) having been scheduled to be read from a channel being written (Busy) on the basis of 32-byte XOR parity included in the read pieces of data of the ten channels and data Ch_info indicating the channel being written (Busy). The XOR control section 216 overwrites the 32-byte XOR parity among the inputted pieces of data of the ten channels with the restored 32-byte data. The XOR control section 216 outputs 320-byte data obtained by the overwriting to the ECP control section 217.

When the 320-byte data is inputted from the XOR control section 216, the ECP control section 217, on the basis of a 7-byte patch included in the inputted 320 byte-data and a data pointer indicating the position of a failed bit, restores data lost due to the failed bit in data (313-byte data) excluding the 7-byte patch among the 320-byte data inputted from the XOR control section 216. The restored 313-byte data corresponds to the ECC2 codeword illustrated in FIG. 14. The ECP control section 217 outputs the 313-byte data (ECC2 codeword) to the ECC control section 218.

The ECC control section 218 includes eight ECC1 decoders and one ECC2 decoder. When the ECC2 codeword is inputted from the ECP control section 217, the ECC control section 218 extracts 27-byte ECC2 parity from the inputted ECC2 codeword. The ECC control section 218 further divides data (286-byte data) excluding the 27-byte ECC2 parity, among the inputted ECC2 codeword, into eight pieces of data (286-bit data). The divided 286-bit data corresponds to the ECC1 codeword illustrated in FIG. 14.

The ECC control section 218 outputs the 286-bit data (ECC1 codeword) in eight pieces one by one to the respective ECC1 decoders. On the basis of the 18-bit ECC1 parity included in the inputted ECC1 codeword, each ECC1 decoder corrects an error up to 2 bits in the inputted ECC1 codeword. Each ECC1 decoder outputs the corrected 286-bit data (ECC1 codeword) to the ECC2 decoder. On the basis of the eight ECC1 codewords (286-byte data) inputted from the respective ECC1 decoders and the 27-byte ECC2 parity, the ECC2 decoder corrects an error up to 5 bits in the inputted eight ECC1 codewords (286-byte data) excluding the 27-byte ECC2 parity. The ECC2 decoder outputs the corrected 268-byte data to the CRC & address check section 215.

When the 268-byte data is inputted from the ECC control section 218, the CRC & address check section 215 confirms presence or absence of an error by comparing an address of the inputted 268-byte data and a logical address to be accessed by the host computer 100 with each other. When confirming that there is no error, the CRC & address check section 215 outputs the 268-byte data to the separation section 222. The separation section 222 transmits, to the host computer 100, data (user data +metadata) corresponding to the logical address to be accessed by the host computer 100, from among the inputted 268-byte data. The data to be transmitted to the host computer 100 is, for example, 66-byte data (64-byte user data+2-byte metadata), 132-byte data (128-byte user data+4-byte metadata), or 264-byte data (258-byte user data+8-byte metadata).

(Data Writing)

For example, as illustrated in FIG. 16, the controller 210 includes the write buffer section 214, the CRC & address check section 215, the ECC control section 218 including eight ECC1 encoders and one ECC2 encoder, the ECP control section 217, the XOR control section 216, and the separation section 222.

When a write request including data (user data +metadata) is inputted from the host computer 100, the write buffer section 214 reads a data part (256-byte user data, 8-byte metadata) in sectors, to which addresses included in the inputted write request belong, in a case where the write request has a size of 66 bytes or 132 bytes. The write buffer section 214 overwrites the read data part with the data received from the host computer 100, and temporarily stores the resulting 264-byte data. In a case where the write request has a size of 264 bytes, the write buffer section 214 performs no such reading as described above, and temporarily stores the data received from the host computer 100 as it is in the write buffer section 214. At this time, the write buffer section 214 updates the unwritten data amount Que as needed. The write buffer section 214 outputs the data (user data +metadata) to the CRC & address check section 215 at a predetermined timing.

When the 264-byte data is inputted from the write buffer section 214, the CRC & address check section 215 generates 32-bit CRC on the basis of the inputted 264-byte data. The CRC & address check section 215 acquires XOR on a bit-by-bit basis using the generated 32-bit CRC and a logical address value, thereby generating a 4-byte logical address. The CRC & address check section 215 outputs, to the ECC control section 218, 268-byte data including the 264-byte data inputted from the write buffer section 214 and the generated 4-byte logical address.

The ECC control section 218 includes eight ECC1 encoders and one ECC2 encoder. When the 268-byte data is inputted from the CRC & address check section 215, the ECC control section 218 divides the inputted 268-byte data into eight pieces of data (268-bit data). The ECC control section 218 outputs the divided eight pieces of data (268-bit data) one by one to the respective ECC1 encoders. Each ECC1 encoder generates 18-bit ECC parity from the inputted 268-bit data on the basis of a BCH code. Each ECC1 encoder generates 286-bit data using the inputted 268-bit data and the generated 18-bit ECC parity. The generated 286-bit data corresponds to the ECC1 codeword illustrated in FIG. 14. That is, when receiving a write command including the user data, the controller 210 generates a plurality of ECC1 codewords using the received user data and the ECC parity enabling error correction of a relatively low number of bits generated on the basis of the received user data.

Each ECC1 encoder outputs the generated 286-bit data (ECC1 codeword) to the ECC2 encoder. When the ECC1 codeword is inputted from each ECC1 encoder, the ECC2 encoder generates 27-byte ECC2 parity on the basis of the inputted eight ECC1 codewords. The ECC2 encoder generates the 313-byte ECC2 codeword using the eight ECC1 codewords inputted from the respective ECC1 encoders and the 27-byte ECC2 parity. That is, the controller 210 generates the ECC2 codeword using the generated plurality of ECC1 codewords and the ECC2 parity, which enables error correction of a relatively high number of bits, generated on the basis of the generated plurality of ECC1 codewords. The ECC2 encoder outputs the generated ECC2 codeword to the ECP control section 217.

The ECP control section 217 generates a 7-byte patch on the basis of the 313-byte ECC2 codeword and a data pointer indicating the position of a failed bit. The ECP control section 217 generates 320-byte data using the 313-byte ECC2 codeword and the generated 7-byte patch. The ECP control section 217 outputs the generated 320-byte data to the XOR control section 216. The XOR control section 216 generates 32-byte XOR parity on the basis of the 320-byte data inputted from the ECP control section 217. The XOR control section 216 generates 352-byte data (data of one sector) using the 320-byte data inputted from the ECP control section 217 and the 32-byte XOR parity. The XOR control section 216 outputs the generated 352-byte data (data of one sector) to the separation section 222. That is, the 352-byte data (data of one sector) is write data to be written into the memory package group 230, and is configured by the 320-byte data (313-byte ECC2 codeword+7-byte patch) including the user data and the XOR parity generated on the basis of the 320-byte data (313-byte ECC2 codeword+7-byte patch).

For example, the separation section 222 distributes and writes the 320-byte data (313-byte ECC2 codeword+7-byte patch) into ten channels (ten 3DXP packages 230-$i$) excluding one channel (eleven 3DXP packages 230-$i$), among eleven channels (eleven 3DXP packages 230-$i$), and writes the XOR parity generated on the basis of the 320-byte data (313-byte ECC2 codeword+7-byte patch) into the remaining one channel (remaining one 3DXP package 230-$i$). That is, the controller 210 outputs the data including the generated ECC2 codeword as write data to the eleven channels (eleven 3DXP packages 230-$i$).

The separation section 222 extracts data (user data+metadata) included in the write request and data such as parity for the data from among the inputted 352-byte data (data of one sector), and distributes and writes the extracted data into channels of the number corresponding to a size of the extracted data. Here, in a case where the data (user data+metadata) included in the write request has a size of 66 bytes, the separation section 222 extracts 160-byte data from among the inputted 352-byte data (data of one sector), and distributes and writes the extracted data into the total of five channels of ch. 0, ch. 1, ch. 8, ch. 9, and ch. 10, for example.

In addition, in a case where the data (user data+metadata) included in the write request has a size of 132 bytes, the separation section 222 extracts 224-byte data from among the inputted 352-byte data (data of one sector), and distributes and writes the extracted data into the total of seven channels of ch. 0, ch. 1, ch. 2, ch. 3, ch. 8, ch. 9, and ch. 10, for example. In a case where the data (user data+metadata) included in the write request has a size of 264 bytes, the separation section 222 distributes and writes the inputted 352-byte data into the total of eleven channels of ch. 0 to ch. 10, for example.

(Arrangement of Two-Tier ECC Codewords)

FIG. 17 illustrates an example of arrangement of two-tier ECC codewords. In a case where a write request including the user data is inputted from the host computer 100, for example, the controller 210 distributes and writes the inputted user data into channels (3DXP packages 230-$i$) of the number corresponding to a size of the user data.

In a case where a write request including 64-byte user data is inputted from the host computer 100, for example, the controller 210 distributes and writes the inputted 64-byte user data into two channels ({ch. 0, ch. 1}, {ch. 2, ch. 3}, {ch. 4, ch. 5}, or {ch. 6, ch. 7}) having shared address bus terminals (ca1, ca2). At this time, for example, the controller 210 writes metadata (2 bytes), a logical address (8 bits), ECC1 parity (36 bits), and a patch (2 bits) for the inputted 64-byte user data into one 3DXP package 230-$i$ via one channel (e.g., ch. 8). That is, in a case where the write request including the 64-byte user data is inputted from the host computer 100, for example, the controller 210 distributes and writes two ECC1 codewords configured by the inputted 64-byte user data as well as the metadata (2 bytes), the logical address (8 bits), the ECC1 parity (36 bits), and the patch (2 bits) for the inputted 64-byte user data into three 3DXP packages 230-$i$.

Further, for example, the controller 210 writes ECC2 parity (27 bytes) and a patch (5 bytes) for the inputted 64-byte user data into one 3DXP package 230-$i$ via one channel (e.g., ch. 9). Further, for example, the controller 210 writes XOR parity (32 bytes) for the inputted 64-byte user data into one 3DXP package 230-$i$ via one channel (e.g., ch. 9).

In a case where a write request including 128-byte user data is inputted from the host computer 100, for example, the controller 210 writes the inputted 128-byte user data into two 3DXP packages 230-$i$ via two pairs of channels (e.g., {ch. 0, ch. 1, ch. 2, ch. 3}, {ch. 2, ch. 3, ch. 4, ch. 5}, or {ch. 4, ch. 5, ch. 6, ch. 7}) having shared address bus terminals (ca1, ca2). At this time, for example, the controller 210 writes metadata (4 bytes), a logical address (16 bits), ECC1 parity (72 bits), and a patch (2 bits) for the inputted 128-byte user data into one 3DXP package 230-$i$ via one channel (e.g., ch. 8). That is, in a case where the write request including the 128-byte user data is inputted from the host computer 100, for example, the controller 210 distributes and writes four ECC1 codewords configured by the inputted 128-byte user data as well as the metadata (4 bytes), the logical address (16 bits), the ECC1 parity (72 bits), and the patch (2 bits) for the inputted 128-byte user data into five 3DXP packages 230-$i$.

Further, for example, the controller 210 writes ECC2 parity (27 bytes) and a patch (5 bytes) for the inputted 128-byte user data into one 3DXP package 230-$i$ via one channel (e.g., ch. 9). Further, for example, the controller 210 writes XOR parity (32 bytes) for the inputted 128-byte user data into one 3DXP package 230-$i$ via one channel (e.g., ch. 9).

FIG. 18 illustrates an example of arrangement of two-tier ECC codewords. In the arrangement illustrated in FIG. 17, in a case where data (e.g., data such as parity) different from the user data is constantly inputted to ch. 8, ch. 9, and ch. 10, data access is concentrated on ch. 8, ch. 9, and ch. 10 upon writing the data into the 3DXP package group 230. At this time, characteristics of the respective 3DXP packages 230-*i* coupled to ch. 8, ch. 9, and ch. 10 on which data access is concentrated may possibly be deteriorated at an early stage. Accordingly, arrangement of two-tier ECC codewords is desirable in which data access is distributed.

Therefore, for example, as illustrated in FIG. 18, the controller 210 may divide a physical address (PA) inputted from the host computer 100 by the number of channels (e.g., eleven); on the basis of a value of the resulting remainder, a channel may be dynamically set, into which data (e.g., data such as parity) different from the user data is written.

For example, when PA mod (value of remainder)=0 holds true, the controller 210 writes data (e.g., data such as parity) different from the user data via ch. 8 and chs. 9 and 10. For example, when the PA mod (value of remainder)=1 holds true, the controller 210 writes data (e.g., data such as parity) different from the user data via ch. 9 and chs. 10 and 0. For example, when the PA mod (value of remainder) increases by an increment of 1, as 2, 3, 4, 5, 6, 7, 8, 9, and 10, the controller 210 shifts channels into which the data (e.g., data such as parity) different from the user data is written. In this manner, dynamically shifting channels into which the data (e.g., data such as parity) different from the user data is written makes it possible to prevent data access from being concentrated on a specific channel.

[Effects]

Next, description is given of effects of the memory module 200 according to an embodiment.

A rewritable semiconductor storage having non-volatility has heretofore been known. In recent years, a resistance-change RAM (ReRAM) has attracted attention as a rewritable semiconductor storage that has a storage capacity exceeding that of a DRAM while having non-volatility. The ReRAM records information depending on a state of a resistance value of a cell varying with application of a voltage. In particular, Xp-ReRAM has a cell structure in which a resistance change element (VR) functioning as a storage element and a selector element (SE) having bidirectional diode characteristics are coupled in series at an intersection part of a word line and a bit line.

Incidentally, the memory module including the semiconductor storage described above and the controller that controls access to the semiconductor storage described above is required to have a high reading speed equivalent to that of the DRAM.

In the present embodiment, the Row address is inputted to the 3DXP package 230-*i* via the address bus terminal ca1, and then the Column address is inputted to the 3DXP package 230-*i* via the address bus terminal ca2, thereby allowing pieces of data corresponding to the Row address and the Column address to be read from the 3DXP package 230-*i*. Thus, for example, a first logical address, which is a portion of the logical address included in the read command, is converted into the Row address, and a second address, which is the rest of the logical address included in the read command, is converted into the Column address within a period (hereinafter, referred to as a "first period") in which the Row address is inputted to the 3DXP package 230-*i* via the address bus terminal ca1. As a result, as compared with a case where address conversion and address input to a non-volatile memory are performed in turn, with only an address bus terminal of one system being provided in the non-volatile memory, for example, it is possible to shorten time (read latency) required for reading, at least by time required for converting the second logical address into the address bus terminal ca1. Accordingly, it is possible to obtain the high reading speed.

In the present embodiment, within the first period, the second address, which is the rest of the logical address included in the read command, is converted into the Column address. This makes it possible to shorten time (read latency) required for reading, at least by time required for converting the second logical address into the address bus terminal ca1. Accordingly, it is possible to obtain the high reading speed.

In the present embodiment, within the first period, the Column address lookup information 221 is read from the DRAM 220, and the second logical address is converted into the Column address using the read Column address lookup information 221. This makes it possible to shorten time (read latency) required for reading, at least by time required for converting the second logical address into the address bus terminal ca1. Accordingly, it is possible to obtain the high reading speed.

In the present embodiment, when receiving the write command including the user data, the write data including the received user data is distributed and written into the plurality of 3DXP packages 230-*i*. This makes it possible to shorten write latency when receiving a write request from the host computer 100, as compared with a case where the write data including the received user data is written into one 3DXP package 230-*i*.

In the present embodiment, a codeword is distributed and written into a plurality of second non-volatile memories excluding one first non-volatile memory among the plurality of 3DXP packages 230-*i*, and parity is written into the first non-volatile memory. This makes it possible to perform data reading with less errors at high speed even when the 3DXP package 230-*i* is unstable in writing.

In the present embodiment, serial write is performed in which write data is distributed and written into the plurality of 3DXP packages 230-*i* so as not to allow pieces of busy of the plurality of 3DXP packages 230-*i* to overlap each other. Thus, when receiving a read command in the middle of performing the serial write, it is possible to perform parallel read for reading second data excluding first data obtained from the 3DXP package 230-*i* (third non-volatile memory) being busy by the serial write, among data in a data unit including a data storage region corresponding to a logical address included in the received read command, from the plurality of 3DXP packages 230-*i* (fourth non-volatile memory) excluding the third non-volatile memory among the plurality of 3DXP packages 230-*i*. As a result, it is possible to restore the first data using parity included in data obtained by performing the parallel read, and thus to output data corresponding to the logical address among the first data and the second data. Accordingly, it is possible to obtain the high reading speed.

In the present embodiment, serial read is performed in which data in a data unit including a data storage region corresponding to a predetermined address is read from the plurality of 3DXP packages 230-*i* so as not to allow pieces of busy of the plurality of 3DXP packages 230-*i* to overlap each other. Thus, in a case of receiving a write command including user data in the middle of performing the serial read, it is possible to perform parallel read for reading second data excluding first data obtained from the 3DXP package 230-*i* (first non-volatile memory) being busy by the serial read, among data in a data unit including a data storage region into which the received user data is scheduled to be written, from the plurality of 3DXP packages 230-*i* (second non-volatile memory) excluding the first non-volatile memory among the plurality of 3DXP packages 230-*i*. As a result, it is possible to restore the first data using parity included in data obtained by performing the parallel read, to overwrite the first data and the second data with the received user data, and thus to distribute and write third data obtained thereby into the plurality of 3DXP packages 230-*i*. Accordingly, it is possible to shorten the write latency.

In the present embodiment, when receiving a new write command, the serial write is suspended in a case where free space in the buffer exceeds a predetermined threshold, and new write data including user data included in the new write command is distributed and written into the plurality of 3DXP packages 230-*i* at the same timing. Accordingly, it is possible to shorten the write latency.

In the present embodiment, when receiving a write command including user data, the plurality of ECC1 codewords are generated using the received user data and the ECC1 parity enabling error correction of a relatively low number of bits generated on the basis of the received user data. Thereafter, the ECC2 codeword is generated using the generated plurality of ECC1 codewords and the ECC2 parity enabling error correction of a relatively high number of bits generated on the basis of the generated ECC1 codeword, and data including the generated ECC2 codeword is outputted as write data. In this manner, using the two-tier ECC codewords makes it possible to perform error correction accurately as compared with a case of using one-tier ECC codeword.

In the present embodiment, the user data in the plurality of ECC1 codewords is distributed and written into the 3DXP packages 230-*i* of the number corresponding to the size of the user data, the ECC1 parity in the plurality of ECC1 codewords is written into one 3DXP package 230-*i*, and the ECC2 parity in the ECC2 codeword is written into one 3DXP package 230-*i*. This makes it possible to perform error correction accurately as compared with the case of using the one-tier ECC codeword.

In the present embodiment, the XOR parity is generated on the basis of the ECC2 codeword, and the generated XOR parity is written into one 3DXP package 230-*i*. This makes it possible to perform error correction more accurately.

Although the present technology has been described with reference to a plurality of embodiments and modification examples thereof, the present disclosure is not limited to the foregoing embodiments and the like, and may be modified in a wide variety of ways. It is to be noted that the effects described herein are merely exemplary. The effects of the present disclosure are not limited to those described herein. The present disclosure may also have effects other than those described herein.

In addition, for example, the present disclosure may have the following configurations.

(1)

A memory module including:

a non-volatile memory including address bus terminals of two systems and a plurality of writable non-volatile memory cells;

address lookup information which is mapping information indicating a correspondence relationship between a physical address and a logical address, the physical address specifying a data storage region based on some of the plurality of memory cells; and a controller that, upon reception of a read command including the logical address, converts the logical address included in the read command into the physical address using the address lookup information, inputs a first physical address, which is a portion of the physical address obtained by the conversion, to the non-volatile memory via a first address bus terminal of one system among the address bus terminals of the two systems, and then inputs a second physical address, which is a rest of the physical address obtained by the conversion, to the non-volatile memory via a second address bus terminal of another system among the address bus terminals of the two systems, to thereby read data corresponding to the physical address obtained by the conversion from the non-volatile memory.

(2)

The memory module according to (1), in which the controller converts a first logical address, which is a portion of the logical address included in the read command, into the first physical address, and the controller converts a second logical address, which is a rest of the logical address included in the read command, into the second physical address within a first period in which the first physical address is inputted to the non-volatile memory via the first address bus terminal.

(3)

The memory module according to (2), in which the address lookup information includes first address lookup information which is first mapping information indicating a correspondence relationship between the first physical address and the first logical address, and second address lookup information which is second mapping information indicating a correspondence relationship between the second physical address and the second logical address, the semiconductor storage further includes a first storage section that holds the first address lookup information, and a second storage section that holds the second address lookup information, and the controller, within the first period, reads the second address lookup information from the second storage section, and converts the second logical address into the second physical address using the read second address lookup information.

(4)

The memory module according to (3), in which the first storage section is incorporated in the controller, and the second storage section is provided separately from the controller.

(5)

The memory module according to (3) or (4), in which the first physical address includes a Row address in the non-volatile memory, and the second physical address includes a Column address in the non-volatile memory.

(6)

The memory module according to any one of (1) to (5), in which the non-volatile memory includes a plurality of non-volatile memories, and when receiving a write command including user data, the controller distributes and writes write data including the received user data into the plurality of non-volatile memories.

(7)

The memory module according to (6), in which the write data includes a codeword including the user data, and parity generated on a basis of the codeword, and the controller distributes and writes the codeword into a plurality of second non-volatile memories excluding a first non-volatile memory which is one non-volatile memory of the plurality of non-volatile memories, and writes the parity into the first non-volatile memory.

(8)

The memory module according to (7), in which the controller performs serial write for distributing and writing the write data into the plurality of non-volatile memories not to allow pieces of busy of the plurality of non-volatile memories to overlap each other.

(9)

The memory module according to (8), in which, when receiving the read command in the middle of performing the serial write, the controller performs parallel read for reading second data excluding first data obtained from a third non-volatile memory being busy by the serial write among data in a data unit including a data storage region corresponding to the logical address included in the received read command, from a plurality of fourth non-volatile memories excluding the third non-volatile memory of the plurality of non-volatile memories.

(10)

The memory module according to (9), in which the controller restores the first data using the parity included in data obtained by performing the parallel read, and outputs data corresponding to the logical address among the first data and the second data.

(11)

The memory module according to any one of (1) to (10), in which the non-volatile memory includes the plurality of non-volatile memories, and the controller performs serial read for reading data in the data unit including a data storage region corresponding to a predetermined address from the plurality of non-volatile memories not to allow the pieces of busy of the plurality of non-volatile memories to overlap each other.

(12)

The memory module according to (11), in which when receiving the write command including the user data in the middle of performing the serial read, the controller performs parallel read for reading the second data excluding the first data obtained from the first non-volatile memory being busy by the serial read among data in the data unit including the data storage region into which the received user data is scheduled to be written, from the plurality of second non-volatile memories excluding the first non-volatile memory of the plurality of non-volatile memories, and the controller restores the first data using the parity included in data obtained by performing the parallel read, overwrites the first data and the second data with the received user data, and distributes and writes third data obtained thereby into the plurality of non-volatile memories.

(13)

The memory module according to any one of (8) to (10), in which the controller includes a buffer that stores the received user data, and in a case where free space of the buffer exceeds a predetermined threshold, the controller, upon reception of a new write command, suspends the serial write, and distributes and writes new write data including user data included in the new write command into the plurality of non-volatile memories at a same timing.

(14)

The memory module according to any one of (1) to (13), in which the non-volatile memory includes the plurality of non-volatile memories, the controller, upon reception of the write command including the user data, generates a plurality of first codewords using the received user data and first error correction data enabling error correction of a relatively low number of bits generated on a basis of the received user data, the controller then generates a second codeword using the generated plurality of first codewords and second error correction data enabling error correction of a relatively high number of bits generated on a basis of the generated first codewords, and the controller outputs data including the generated second codeword as the write data.

(15)

The memory module according to (14), in which the controller distributes and writes pieces of the user data in the plurality of first codewords into first non-volatile memories of the number corresponding to sizes of the pieces of the user data, the controller writes pieces of the first error correction data in the plurality of first codewords into one second non-volatile memory, and the controller writes the second error correction data in the second codeword into one third non-volatile memory.

(16)

The memory module according to (15), in which the controller generates XOR parity on a basis of the second codeword, and the controller writes the generated XOR parity into one fourth non-volatile memory.

According to the memory module of an embodiment of the present disclosure, the first physical address which is a portion of the physical address is inputted to the non-volatile memory via the first address bus terminal, and then the second physical address which is the rest of the physical address is inputted to the non-volatile memory via the second address bus terminal, to thereby allow data corresponding to the physical address from the non-volatile memory. This makes it possible, for example, to convert the first logical address, which is a portion of the logical address included in the read command, into the first physical address, and to convert the second logical address, which is the rest of the logical address included in the read command, into the second physical address, within a period in which the first physical address is inputted to the non-volatile memory via the first address bus terminal. As a result, as compared with a case where address conversion and address input to the non-volatile memory are performed in turn, with only the address bus terminal of one system being provided in the non-volatile memory, for example, it is possible to shorten time (read latency) required for reading, at least by time required for converting the second logical address into the second physical address. Accordingly, it is possible to obtain the high reading speed. It is to be noted that the effects of the present disclosure are not necessarily limited to the effects described herein, and may be any of the effects described herein.

This application claims the benefit of Japanese Priority Patent Application JP2020-083231 filed with the Japan Patent Office on May 11, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A memory module, comprising:
   a non-volatile memory including:
      a first address bus terminal of a first system of two systems;
      a second address bus terminal of a second system of the two systems; and
      a plurality of writable non-volatile memory cells;
   address lookup information which is mapping information indicating a correspondence relationship between a physical address and a logical address,
      wherein the physical address specifies a data storage region based on a first number of writable non-volatile memory cells of the plurality of writable non-volatile memory cells; and
   a controller configured to:
      convert, upon reception of a read command including the logical address, the logical address included in the read command into the physical address using the address lookup information, wherein the conversion of the logical address into the physical address comprises:
      convert a first logical address, which is a first portion of the logical address included in the read command, into a first physical address,
         wherein the first physical address is a first portion of the physical address obtained by the conversion of the physical address; and
      convert a second logical address, which is a second portion of the logical address included in the read command, into a second physical address, wherein
         the second portion of the logical address is different from the first portion of the logical address,
         the second physical address is a second portion of the physical address, and
         the second portion of the physical address is different from the first portion of the physical address;
      input the first physical address, to the non-volatile memory via the first address bus terminal,
         wherein the second logical address is converted into the second physical address within a first period in which the first physical address is inputted to the non-volatile memory via the first address bus terminal; and
      input the second physical address to the non-volatile memory via the second address bus terminal; and
      read data, corresponding to the physical address obtained by the conversion, from the non-volatile memory based on the first physical address and the second physical address.

2. The memory module according to claim 1, wherein the address lookup information includes:
   first address lookup information which is first mapping information indicating a correspondence relationship between the first physical address and the first logical address, and
   second address lookup information which is second mapping information indicating a correspondence relationship between the second physical address and the second logical address,
   the memory module further comprises semiconductor storage which includes:
      a first storage section that holds the first address lookup information; and
      a second storage section that holds the second address lookup information, and
   the controller is further configured to:
      read, within the first period, the second address lookup information from the second storage section, and
      convert the second logical address into the second physical address using the read second address lookup information.

3. The memory module according to claim 2, wherein the first storage section is incorporated in the controller, and
   the second storage section is provided separately from the controller.

4. The memory module according to claim 2, wherein the first physical address comprises a Row address in the non-volatile memory, and
   the second physical address comprises a Column address in the non-volatile memory.

5. The memory module according to claim 1, wherein the non-volatile memory comprises a plurality of non-volatile memories, and
   when receiving a write command including user data, the controller is further configured to distribute and write write data including the received user data into the plurality of non-volatile memories.

6. The memory module according to claim 5, wherein the write data includes
   a codeword including the user data, and
   parity which is generated based on the codeword, and
   the controller is further configured to distribute and write the codeword into a plurality of second non-volatile memories of the plurality of non-volatile memories,
      wherein the plurality of second non-volatile memories excludes a first non-volatile memory of the plurality of non-volatile memories; and
   write the parity into the first non-volatile memory.

7. The memory module according to claim 6, wherein the controller is further configured to perform serial write to distribute and write the write data into the plurality of non-volatile memories not to allow pieces of busy of the plurality of non-volatile memories to overlap each other.

8. The memory module according to claim 7, wherein,
   when receiving the read command in middle of performing the serial write, the controller is further configured to perform parallel read to read second data, excluding first data, from a plurality of fourth non-volatile memories excluding a third non-volatile memory of the plurality of non-volatile memories,
   the first data is obtained from the third non-volatile memory which is busy by the serial write, and
   the second data is among data in a data unit including the data storage region corresponding to the logical address which is included in the received read command.

9. The memory module according to claim 8, wherein the controller is further configured to:
   restore restores the first data using the parity included in data obtained by the parallel read; and
   output data corresponding to the logical address among the first data and the second data.

10. The memory module according to claim 1, wherein the non-volatile memory comprises a plurality of non-volatile memories, and the controller is further configured to perform serial read to read data in a data unit which includes the data storage region corresponding to a specific address from the plurality of non-volatile memories not to allow pieces of busy of the plurality of non-volatile memories to overlap each other.

11. The memory module according to claim 10, wherein when receiving a write command including user data in middle of performing the serial read, the controller is further configured to perform parallel read to read second data, excluding first data from a plurality of second non-volatile memories excluding a first non-volatile memory of the plurality of non-volatile memories, the first data is obtained from a first non-volatile memory which is busy by the serial read, and the second data is among data in the data unit including the data storage region into which the received user data is scheduled to be written, and the controller is further configured to:
  restore the first data using a parity included in the second data obtained by the parallel read,
  overwrite the first data and the second data with the received user data, and
  distribute and write third data obtained into the plurality of non-volatile memories.

12. The memory module according to claim 7, wherein the controller includes a buffer that stores the user data, and in a case where free space of the buffer exceeds a specific threshold, the controller is further configured to:
  suspend, upon reception of a new write command, the serial write; and
  distribute and write new write data, including the user data included in the new write command, into the plurality of non-volatile memories at a same timing.

13. The memory module according to claim 1, wherein the non-volatile memory comprises a plurality of non-volatile memories, the controller is further configured to:
  generate, upon reception of a write command including user data, a plurality of first codewords, wherein
    each codeword of the plurality of first codewords comprises the user data and first error correction data, and
    the first error correction data enables error correction of a first number of bits generated based on the received user data,
  generate a second codeword using the generated plurality of first codewords and second error correction data which enables error correction of a second number of bits generated based on the generated plurality of first codewords, wherein the second number of bits are higher with respect to the first number of bits, and
  output data including the generated second codeword as write data.

14. The memory module according to claim 13, wherein the controller is further configured to:
  distribute and write pieces of the user data in the plurality of first codewords into a plurality of first non-volatile memories of the plurality of non-volatile memories corresponding to sizes of the pieces of the user data;
  write pieces of the first error correction data in the plurality of first codewords into a second non-volatile memory of the plurality of non-volatile memories; and
  write the second error correction data in the second codeword into a third non-volatile memory of the plurality of non-volatile memories.

15. The memory module according to claim 14, wherein the controller is further configured to:
  generate XOR parity based on the second codeword, and write the generated XOR parity into a fourth non-volatile memory of the plurality of non-volatile memories.

16. A memory module, comprising:
a non-volatile memory including:
  a plurality of non-volatile memories;
  a first address bus terminal of a first system of two systems;
  a second address bus terminal of a second system of the two systems; and
  a plurality of writable non-volatile memory cells;
address lookup information which is mapping information indicating a correspondence relationship between a physical address and a logical address,
  wherein the physical address specifies a data storage region based on a first number of writable non-volatile memory cells of the plurality of writable non-volatile memory cells; and
a controller configured to:
  convert, upon reception of a read command including the logical address, the logical address included in the read command into the physical address using the address lookup information,
  input a first physical address, which is a first portion of the physical address obtained by the conversion of the logical address, to the non-volatile memory via the first address bus terminal, and
  input a second physical address, which is a second portion of the physical address obtained by the conversion, to the non-volatile memory via the second address bus terminal, wherein the first portion of the physical address is different from the second portion of the physical address;
  read data, corresponding to the physical address obtained by the conversion, from the non-volatile memory based on the first physical address and the second physical address;
  generate, upon reception of a write command including user data, a plurality of first codewords, wherein
    each codeword of the plurality of first codewords comprises the user data and first error correction data, and
    the first error correction data enables error correction of a first number of bits generated based on the received user data,
  generate a second codeword using the generated plurality of first codewords and second error correction data which enables error correction of a second number of bits generated based on the generated plurality of first codewords, wherein the second number of bits are higher with respect to the first number of bits, and
  output data including the generated second codeword as write data.

* * * * *